United States Patent
Tomura et al.

(10) Patent No.: US 9,922,806 B2
(45) Date of Patent: Mar. 20, 2018

(54) ETCHING METHOD AND PLASMA PROCESSING APPARATUS

(71) Applicant: Tokyo Electron Limited, Tokyo (JP)

(72) Inventors: Maju Tomura, Miyagi (JP); Ryohei Takeda, Miyagi (JP); Ryuichi Takashima, Miyagi (JP); Yoshinobu Ooya, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/180,273

(22) Filed: Jun. 13, 2016

(65) Prior Publication Data

US 2016/0379856 A1 Dec. 29, 2016

(30) Foreign Application Priority Data

Jun. 23, 2015 (JP) ................................. 2015-126038
Dec. 21, 2015 (JP) ................................. 2015-248345

(51) Int. Cl.
*H01L 21/67* (2006.01)
*H01L 21/311* (2006.01)
*H01J 37/32* (2006.01)

(52) U.S. Cl.
CPC .. *H01J 37/32642* (2013.01); *H01J 37/32082* (2013.01); *H01J 37/32146* (2013.01); *H01J 37/32165* (2013.01); *H01J 37/32724* (2013.01); *H01J 37/32935* (2013.01); *H01L 21/31116* (2013.01); *H01J 2237/334* (2013.01)

(58) Field of Classification Search
None
See application file for complete search history.

(56) References Cited

U.S. PATENT DOCUMENTS

| 5,328,558 | A | * | 7/1994 | Kawamura | H01L 21/31116 |
| | | | | | 148/DIG. 17 |
| 5,352,324 | A | * | 10/1994 | Gotoh | H01J 37/32706 |
| | | | | | 156/345.28 |
| 5,468,341 | A | * | 11/1995 | Samukawa | H01J 37/32192 |
| | | | | | 156/345.41 |
| 5,854,136 | A | * | 12/1998 | Huang | H01L 21/31116 |
| | | | | | 216/67 |

(Continued)

FOREIGN PATENT DOCUMENTS

| JP | H8-92765 | 4/1996 |
| JP | H10-303185 | 11/1998 |
| JP | 3084497 | 9/2000 |

*Primary Examiner* — Allan Olsen
(74) *Attorney, Agent, or Firm* — IPUSA, PLLC

(57) ABSTRACT

An etching method is provided. In the etching method, a silicon oxide film is etched by using plasma in a first condition. In the first condition, a surface temperature of a substrate is controlled to have a temperature lower than −35 degrees C., and the plasma is generated from a hydrogen-containing gas and a fluorine-containing gas by using first radio frequency power output from a first radio frequency power source and second radio frequency power output from a second radio frequency power source. Next, the silicon oxide film is etched by using the plasma in a second condition. In the second condition, the output of the second radio frequency power from the second radio frequency power source is stopped. The silicon oxide film is etched by using the plasma alternately in the first condition and in the second condition multiple times.

21 Claims, 16 Drawing Sheets

(56) References Cited

U.S. PATENT DOCUMENTS

| | | | | |
|---|---|---|---|---|
| 9,659,789 B2* | 5/2017 | Takeda | | H01L 21/31116 |
| 2001/0008226 A1* | 7/2001 | Hung | | H01L 21/02063 |
| | | | | 216/18 |
| 2001/0054601 A1* | 12/2001 | Ding | | C23C 16/517 |
| | | | | 216/68 |
| 2004/0124177 A1* | 7/2004 | Urban | | B81C 1/00579 |
| | | | | 216/67 |
| 2004/0192053 A1* | 9/2004 | Fujimoto | | H01L 21/31116 |
| | | | | 438/697 |
| 2008/0070130 A1* | 3/2008 | Anderson | | G03F 1/32 |
| | | | | 430/5 |
| 2010/0130018 A1* | 5/2010 | Tokashiki | | H01J 37/32082 |
| | | | | 438/710 |
| 2011/0065276 A1* | 3/2011 | Ganguly | | H01L 21/0223 |
| | | | | 438/694 |
| 2012/0211462 A1* | 8/2012 | Zhang | | H01L 21/31116 |
| | | | | 216/13 |
| 2016/0189975 A1* | 6/2016 | Takeda | | H01L 21/31116 |
| | | | | 438/712 |
| 2016/0247666 A1* | 8/2016 | Urakawa | | H01J 37/32174 |

\* cited by examiner

ETCHING METHOD AND PLASMA PROCESSING APPARATUS

CROSS-REFERENCE TO RELATED APPLICATIONS

This patent application is based upon and claims the benefit of priority of Japanese Patent Application No. 2015-126038, filed on Jun. 23, 2015, and Japanese Patent Application No. 2015-248345, filed on Dec. 21, 2015, the entire contents of which are incorporated herein by reference.

BACKGROUND OF THE INVENTION

1. Field of the Invention

The present invention relates to an etching method and a plasma processing apparatus.

2. Description of the Related Art

In order to perform a preferable etching in a substrate plasma etching process, a method of controlling a temperature of a surface of a substrate by using a heater and a cooling mechanism provided in a pedestal for receiving the substrate, is suggested. For example, in an etching process described in Japanese Laid-Open Patent Application Publication No. 10-303185, a process temperature that causes a surface temperature of a substrate to be maintained during an etching, is lower than a plasma heating temperature at which the substrate reaches a state of thermal equilibrium by being heated by plasma. Hence, the surface temperature of the substrate rises due to heat input from the plasma. Hence, Japanese Laid-Open Patent Application Publication No. 10-303185 supposes cooling the substrate by a cooling mechanism to keep the surface temperature of the substrate at the predetermined process temperature.

However, in Japanese Laid-Open Patent Application Publication No. 10-303185, a temperature of a coolant is set at about 20 degrees C. when the plasma heating temperature is 300 degrees C. and the process temperature is 87 degrees C. The disclosure in Japanese Laid-Open Patent Application Publication No. 10-303185 relates to a substrate surface temperature control method in a plasma process under room temperature. Moreover, in Japanese Laid-Open Patent Application Publication No. 10-303185, the temperature of the substrate surface is controlled as described above during the etching to solve a problem of what is called a micro loading. The micro loading is a problem of etching rate differences (non-uniformity) depending on hole sizes when etching via holes, contact holes and the like.

However, because the plasma processes under room temperature and an extremely low temperature environment are different from each other in process characteristics and temperature range to be controlled, problems caused by the heat input from the plasma sometimes differ from each other, and approaches to solve the problems may differ from each other.

SUMMARY OF THE INVENTION

Accordingly, in response to the above discussed problems, embodiments of the present invention provides an etching method and an etching apparatus that prevent depth loading and increase an etching rate when etching a silicon oxide film.

According to one embodiment of the present invention, there is provided an etching method. In the etching method, a silicon oxide film is etched by using plasma in a first condition. In the first condition, a surface temperature of a substrate is controlled to have a temperature lower than −35 degrees C., and the plasma is generated from a hydrogen-containing gas and a fluorine-containing gas by using first radio frequency power output from a first radio frequency power source and second radio frequency power output from a second radio frequency power source. Next, the silicon oxide film is etched by using the plasma in a second condition. In the second condition, the output of the second radio frequency power from the second radio frequency power source is stopped. The silicon oxide film is etched by using the plasma alternately in the first condition and in the second condition multiple times.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Figure 1:
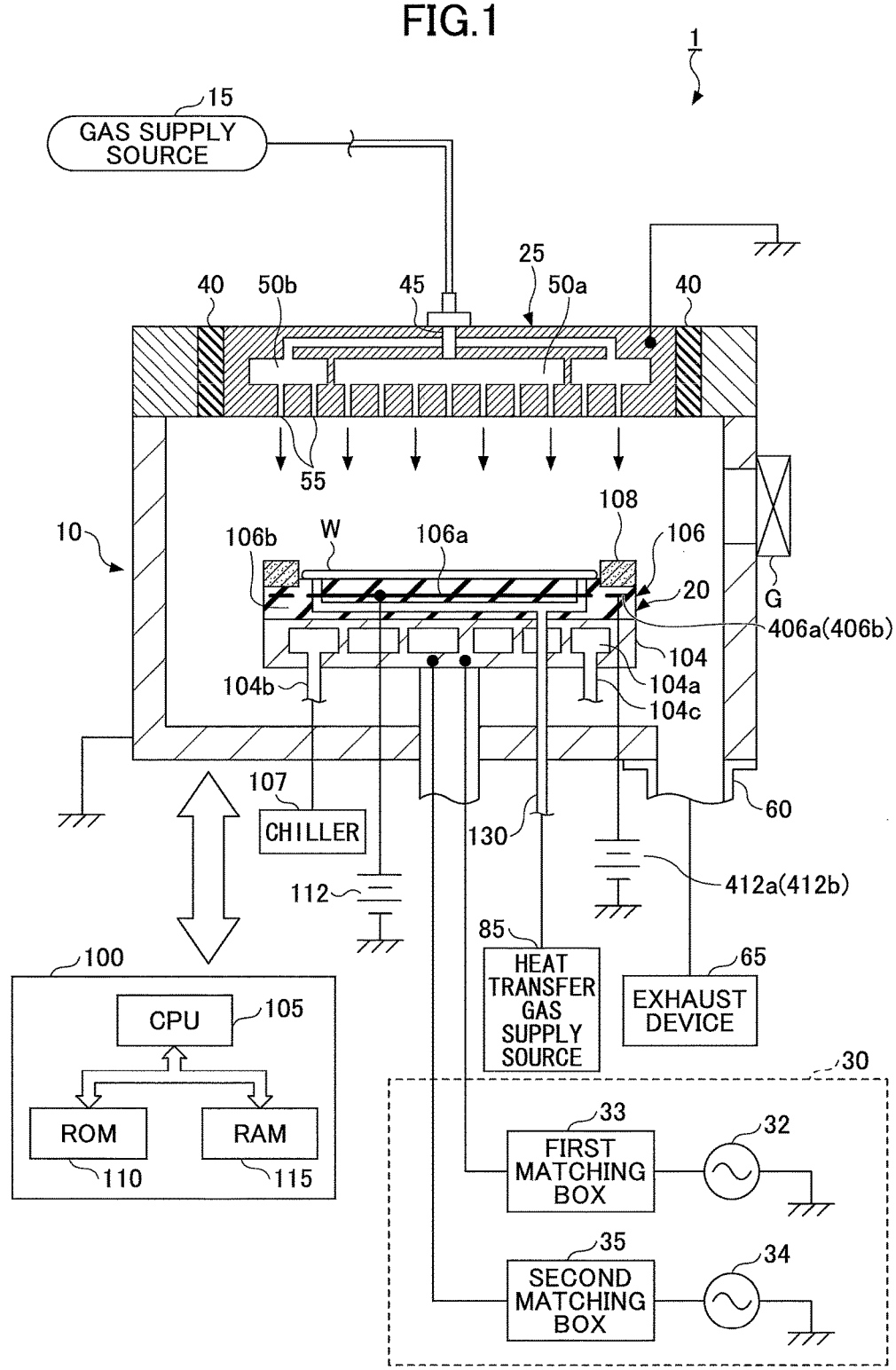
FIG. 1 is a vertical cross-sectional view of an etching apparatus according to an embodiment of the present invention.

A description is given below of embodiments of the present invention, with reference to accompanying drawings. Note that elements having substantially the same functions or features maybe given the same reference numerals and overlapping descriptions thereof may be omitted.

[Overall Configuration of Etching Processing Apparatus]

To begin with, an etching apparatus 1 according to an embodiment of the present invention is described below with reference to FIG. 1. FIG. 1 illustrates an example of a vertical cross section of the etching apparatus 1 according to the embodiment. The etching apparatus 1 according to the embodiment is an example of a plasma processing apparatus that processes a substrate by using plasma. Although the etching apparatus 1 according to the embodiment performs a plasma etching on a wafer, the plasma processing apparatus is not limited to this application, and may be configured to perform a desired plasma process such as a film deposition process and a sputtering process. The etching apparatus 1 of the embodiment is configured to be a parallel plate type plasma processing apparatus (capacitively-coupled plasma processing apparatus) in which a pedestal 20 and a gas shower head 25 are disposed to face each other in a chamber 10. The pedestal 20 also functions as a lower electrode, and the gas shower head 25 also functions as an upper electrode.

The etching apparatus 1 includes the chamber 10 with a surface, for example, made of alumited (anodized) aluminum. The chamber 10 is connected to the ground. The pedestal 20 is installed on a bottom of the chamber and receives a semiconductor wafer (which is hereinafter just referred to as a "wafer W") thereon. The wafer W is an example of a substrate. The pedestal 20 is, for example, made of aluminum (Al), titanium (Ti), silicon carbide (SiC) and the like. An electrostatic chuck 106 for electrostatically attracting the wafer W thereon is provided on an upper surface of the pedestal 20. The electrostatic chuck 106 is configured to have a chuck electrode 106a sandwiched between insulating bodies 106b or surrounded by the insulating body 106b. A direct voltage source 112 is connected to the chuck electrode 106a, and attracts the wafer W on the electrostatic chuck 106 by Coulomb's force by applying a direct voltage HV to the chuck electrode 106a.

A focus ring 108 is disposed at a periphery of the electrostatic chuck 106 so as to surround the pedestal 20. For example, the focus ring 108 is made of silicon or quartz. The focus ring serves to improve uniformity of etching across a surface of the wafer.

The pedestal 20 is supported by a support 104. A refrigerant passage 104a is formed inside the support 104. A refrigerant inlet pipe 104b and a refrigerant outlet pipe 104c are connected to the refrigerant passage 104. A cooling medium output from a chiller 107 such as cooling water and brine circulates through the refrigerant inlet pipe 104b, the refrigerant passage 104a and the refrigerant outlet pipe 104c. The refrigerant serves to draw the heat away from the pedestal 20 and the electrostatic chuck 106 and to cool the pedestal 20 and the electrostatic chuck 106.

A heat transfer gas supply source 85 supplies a heat transfer gas such as helium gas (He) or argon gas (Ar) to a back surface of the wafer W on the electrostatic chuck 106 through a gas supply line 130. Such a configuration allows a temperature of the electrostatic chuck 106 to be controlled by the refrigerant flowing through the refrigerant passage 104a and the heat transfer gas supplied to the back surface of the wafer W. As a result, the temperature of wafer W can be controlled so as to have a predetermined temperature. The heat transfer gas supply source 85 and the gas supply line 130 are an example of a heat transfer gas supply mechanism to supply the heat transfer gas to the back surface of the wafer W.

A power supply device 30 for supplying superimposed power of two frequencies is connected to the pedestal 20. The power supply device 30 includes a first radio frequency power source 32 that supplies first radio frequency power (radio frequency power for generating plasma) of a first frequency and a second radio frequency power source 34 for supplying second radio frequency power (radio frequency power for generating a bias voltage) of a second frequency that is lower than the first frequency. The first radio frequency power source 32 is electrically connected to the pedestal 20 through a first matching box 33. The second radio frequency power source 34 is electrically connected to the lower electrode 20 through a second matching box 35. For example, the first radio frequency power source 32 supplies the first radio frequency power of 60 MHz to the pedestal 20. For example, the second radio frequency power source 34 supplies the second radio frequency power of 13.56 MHz to the pedestal 20. Here, although the first radio frequency power is supplied to the pedestal 20 in the embodiment, the first radio frequency power may be supplied to the gas shower head 25.

The first matching box 33 causes load impedance of the first radio frequency power source 32 to match internal (or output) impedance thereof. The second matching box 35 causes load impedance of the second radio frequency power source 34 to match internal (or output) impedance thereof. The first matching box 33 serves to cause the load impedance of the first radio frequency power source 32 to appear the same as the internal impedance thereof when plasma is generated in the chamber 10. The second matching box 35 serves to cause the load impedance of the second radio frequency power source 34 to appear the same as the internal impedance thereof when plasma is generated in the chamber 10.

The gas shower head 25 is attached to the chamber 10 through a shield ring 40 covering a peripheral side wall thereof so as to close an opening of a ceiling part of the chamber 10. The gas shower head 25 may be electrically grounded as illustrated in FIG. 1. Moreover, by connecting a variable direct current power source to the shower head 25, a predetermined direct current (DC) voltage may be applied to the shower head 25.

A gas introduction port 45 for introducing a gas is formed in the gas shower head 25. The gas shower head 25 includes a diffusion chamber 50a provided on a central side and a diffusion chamber 50b provided on an edge side therein, which are diverged from the gas introduction port 45. The gas supplied from a gas supply source 15 is supplied to the diffusion chambers 50a and 50b through the gas introduction port 45, and diffuses across each of the diffusion chambers 50a and 50b. Then, the gas is introduced toward the pedestal 20 from many gas supply holes 55.

An exhaust port 60 is formed in a bottom surface of the chamber 10, and the chamber 10 is evacuated by an exhaust device 65 connected to the exhaust port 60. Thus, the inside of the chamber 10 can be maintained at a predetermined degree of vacuum. A gate valve G is provided at a side wall of the chamber 10. The gate valve G opens and closes a carry-in/out opening when carrying the wafer in/out of the chamber 10.

The etching apparatus 1 includes a control unit 100 configured to control the operation of the entire apparatus. The control unit 100 includes a CPU (Central Processing Unit) 105, a ROM (Read Only Memory) 110 and a RAM (Random Access Memory) 115. The CPU 105 performs a desired process such as the etching process described later in accordance with a recipe stored in these memory areas. The recipe specifies control information of the apparatus corresponding to process conditions such as process time, a pressure (evacuation of the gas), radio frequency power and voltage, various gas flow rates, temperatures inside the chamber 10 (an upper electrode temperature, a side wall temperature of the chamber 10, a temperature of the wafer W (a temperature of the electrostatic chuck 106) and the like), and a temperature of the refrigerant output from the chiller 107. Here, the recipe specifying programs and process conditions thereof may be stored in a hard disk or a semiconductor memory. Furthermore, the recipe may be set in a predetermined position of the memory area in a state of being stored in a portable computer readable storage medium such as a CD-ROM, a DVD and the like.

When performing an etching process, open and close of the gate valve G is controlled, and a wafer W is carried into the chamber 10 and placed on the pedestal 20. The direct current voltage source 12 applies a direct current voltage HV to the chuck electrode 106a, thereby attracting and holding the wafer W on the electrostatic chuck 106 by Coulomb's force.

Next, a gas for etching and radio frequency power are supplied to the chamber 10, thereby generating plasma. A plasma etching process is performed on the wafer by the generated plasma. After the etching process, the direct current voltage source 112 applies a DC voltage HV having an opposite sign to the DC voltage applied to the chuck electrode 106a while attracting the wafer W to the chuck electrode 106a in order to eliminate the charge of the wafer W, thereby removing the wafer W from the electrostatic chuck 106. The open and close of the gate valve G is controlled, and the wafer W is carried out of the chamber 10.

[Etching Process]

Figure 2A:
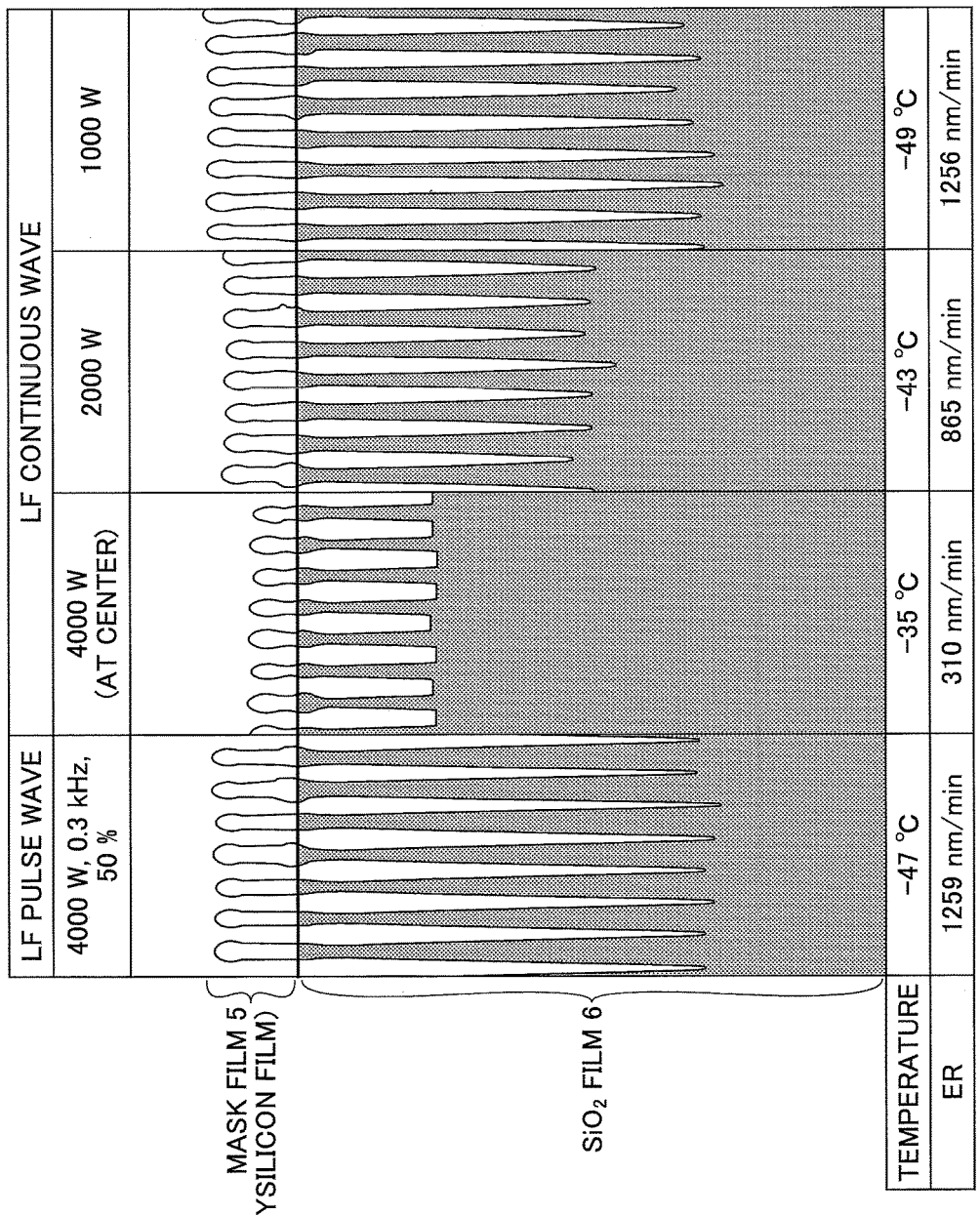
FIGS. 2A and 2B are diagrams showing an example of a method of applying radio frequency power LF and a result thereof in an extremely low temperature etching according to an embodiment of the present invention.

Next, an etching process according to an embodiment, which is performed on a silicon oxide film ($SiO_2$) by using the etching apparatus 1 having the configuration described above, is described below. As shown in FIG. 2A, a silicon oxide film 6, which is an example of a film to be etched, is formed on a wafer W, and a mask film 5 is provided on the silicon oxide film 6. A polysilicon film, an organic film, an amorphous carbon film, a titanium nitride (TiN) film or the like can be used as the mask film 5.

In the etching method according to the embodiment, the etching is performed under an extremely low temperature environment in which the surface temperature of the wafer W is lower than −35 degrees C. This allows the etching process to be performed at an etching rate higher than the etching rate achieved in the etching process performed while keeping the surface temperature of the wafer W at room temperature (e.g., about 25 degrees C. or higher). However, in the plasma etching under the extremely low temperature, the etching rate rapidly decreases when the surface temperature of the wafer W rises. Hence, temperature control of the surface of the wafer W is very important.

FIG. 2A shows a result of examples of having performed etching processes under the following process conditions in an extremely low temperature environment.

Process Conditions:
Temperature (setting temperature of the chiller 107) : −60 degrees C.
Pressure: 60 mT (8.00 Pa)
First Radio Frequency Power HF: 2500 W
Second Radio Frequency Power LF: Shown in FIG. 2B (continuous wave, pulse wave)
Gas Types: Hydrogen ($H_2$)/Carbon Tetrafluoride ($CF_4$).

In the above process conditions, the surface temperature of the wafer W during the process was monitored. The leftmost column of "LF PULSE WAVE" in FIG. 2A shows an etching result of an example of having supplied the second radio frequency power LF having pulse waves of 4000 W, 0.3 kHz, and a duty cycle of 50%. In this case, the surface temperature of the wafer W during the etching was set at −47 degrees C., and the etching rate (ER) was 1259 nm/min. The effective value of the second radio frequency power LF at this time was 2000 W.

The column of "LF CONTINUOUS WAVE" in FIG. 2A shows results of examples of having supplied the second radio frequency power LF having continuous waves of 4000 W, 2000 W and 1000 W under the above conditions. In the second radio frequency power LF having the continuous waves of 2000 W, the surface temperature of the wafer W during the etching was −43 degrees C., and the etching rate was 865 nm/min. According to the result, when the effective value was set at the same 2000 W as the above example, by changing the second radio frequency power from the continuous waves to the pulse waves, the etching rate in the pulse waves was about one-and-a-half times as high as that in the continuous waves (=1259/865).

However, in the second radio frequency power LF having the continuous waves of 4000 W, the surface temperature of the wafer W during the etching (at center) was −35 degrees C., and the etching rate was 310 nm/min, in which a phenomenon of an sluggish etching (which is also hereafter referred to as an "etch stop") occurred. In other words, the result indicates that in the plasma etching under the extremely low temperature etching, there is an area where the surface temperature of the wafer W rapidly rises due to heat input and the etch stop occurs without progress of etching.

In the second radio frequency power LF having the continuous waves of 1000 W, the surface temperature of the wafer W during the etching was −49 degrees C., and the etching rate (ER) was 1256 nm/min. Thus, by keeping the process temperature at the extremely low temperature lower than −35 degrees C., the etch stop can be prevented. Moreover, in the extremely low temperature area, the heat input decreases and the etching rate increases as the second radio frequency power LF is decreased.

Thus, in the extremely low temperature process according to the embodiment, the higher the second radio frequency power LF becomes, the lower the etching rate becomes due to the increase in heat input, and the etch stop occurs when the second radio frequency power LF becomes 4000 W. The result indicates that the etching result completely differs from the result of the room temperature process in which the etching rate increases as the second radio frequency power LF increases.

Figure 2B:
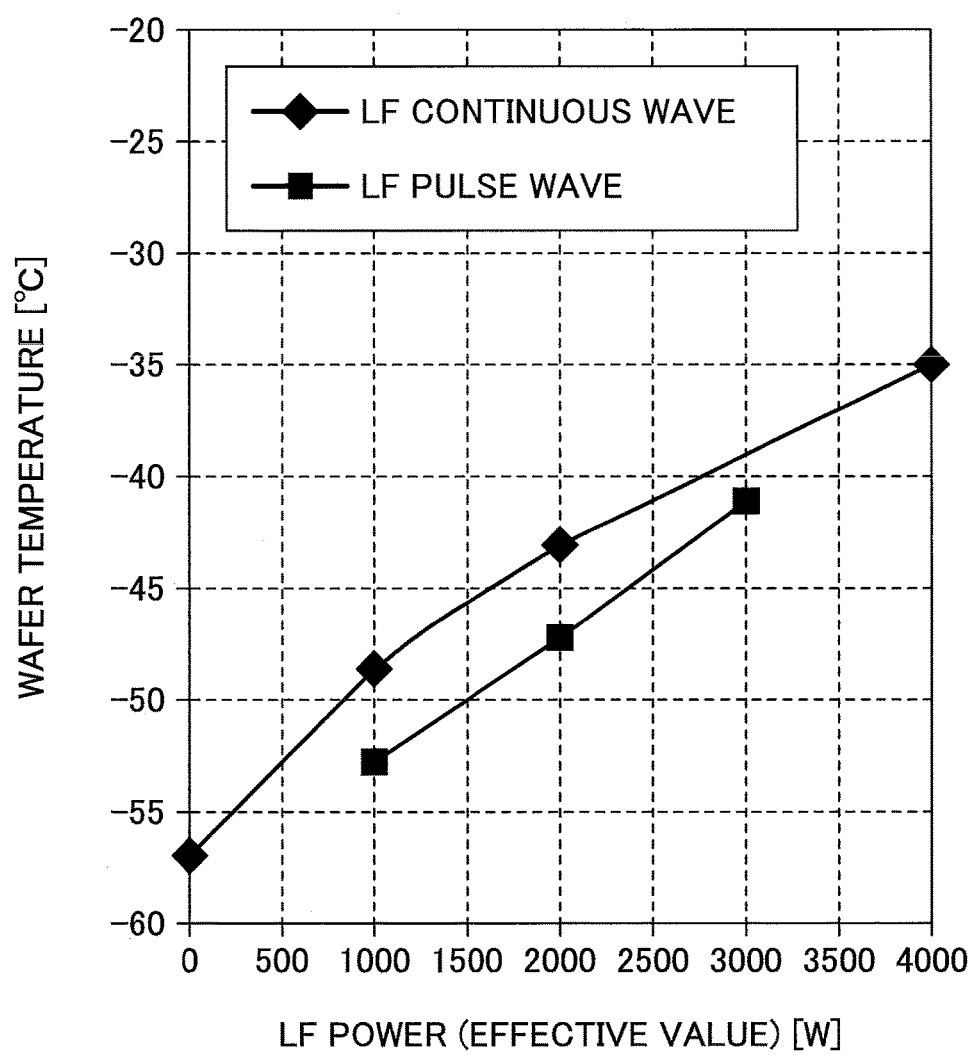

In the result of FIG. 2A, the second radio frequency power LF having the pulse waves of 4000 W, 0.3 kHz, and a duty cycle of 50% showed almost the same surface temperature of the wafer W and etching rate as those of the second ratio frequency LF having the continuous waves of 1000 W. In other words, as shown in FIG. 2B, when the second radio frequency power LF having the pulse waves was supplied, the surface temperature of the wafer W could be made lower than when the second radio frequency power LF having the continuous waves of the same second radio frequency power (effective value) was supplied. Thus, it is noted that when the second radio frequency power LF has the pulse waves, the etching can be performed at a higher etching rate than when the second radio frequency power LF has the continuous waves because the surface temperature of the wafer W can be controlled to become lower against the heat input from the plasma.

Figure 3A:
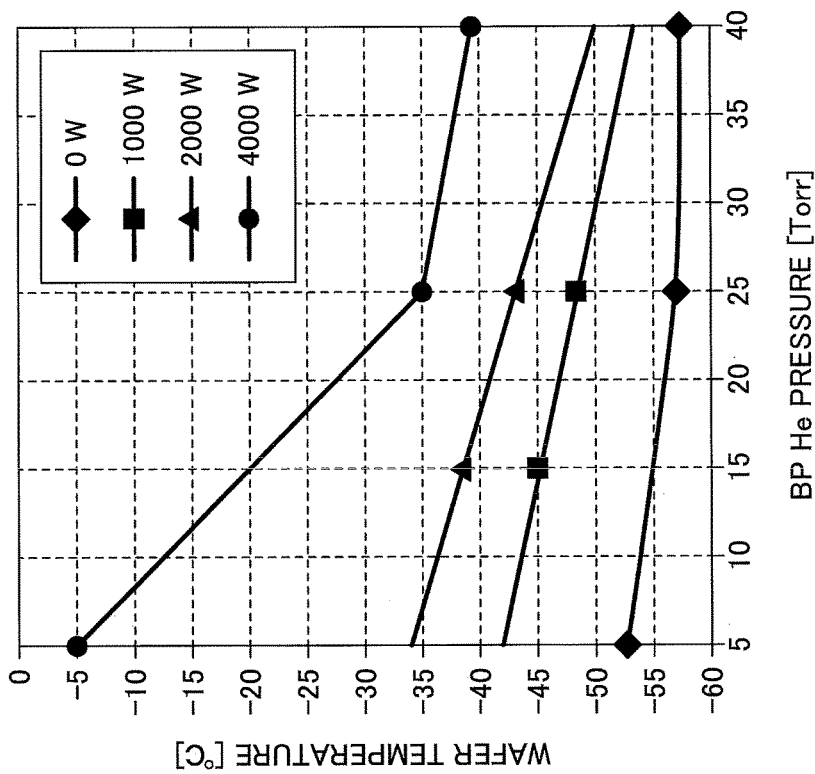
FIGS. 3A and 3B are graphs showing an example of radio frequency power LF dependency and transfer gas dependency of wafer temperatures.
Figure 3B:
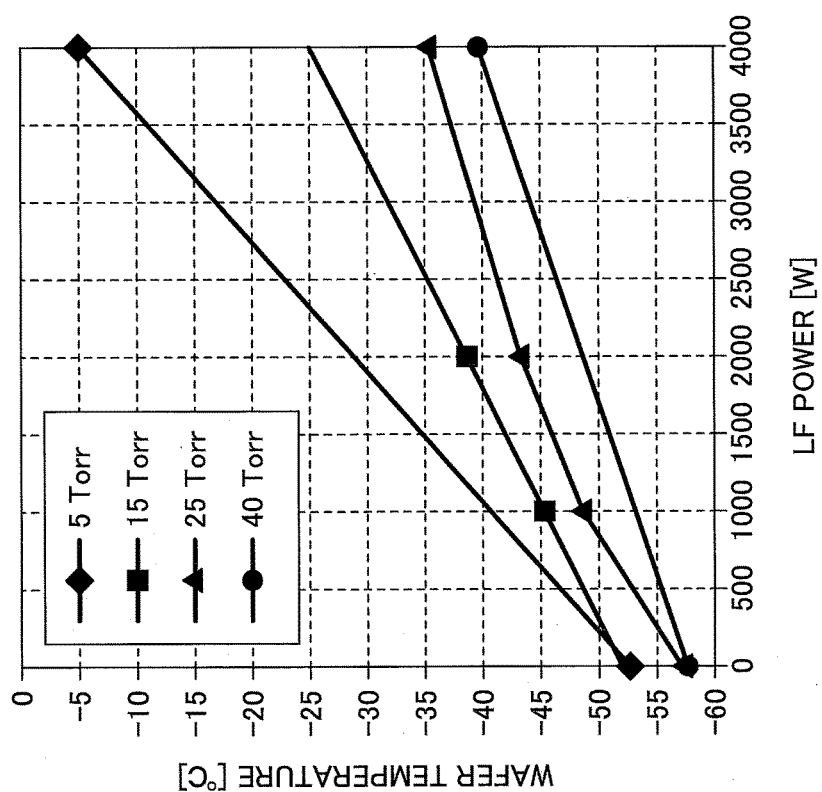

FIGS. 3A and 3B show the relationship among the second high frequency power LF, the pressure of the back surface of the wafer W and the surface temperature of the wafer W by control of a flow rate of a heat transfer gas (He gas). A graph in FIG. 3A shows temperature changes of the surface of the wafer W with respect to the second radio frequency power LF when the pressure of the back surface of the wafer W is changed into 5 Torr (666.6 Pa), 15 Torr (2000 Pa), 25 Torr (3333 Pa), and 40 Torr (5333 Pa). A graph shown in FIG. 3B shows temperature changes of the surface of the wafer W with respect to the pressure of the back surface of the wafer W when the second radio frequency power LF is changed into 0 W, 1000 W, 2000 W, and 4000 W. The result has indicated that it is difficult to effectively prevent the increase in surface temperature of the wafer W only by the pressure control of the back surface of the wafer W.

From the above discussion, the embodiment proposes an etching method of performing an etching process intermittently by providing a period when the second radio frequency power LF is not supplied in etching the silicon oxide film 6 while the surface temperature of the wafer W is controlled to have an extremely low temperature. Thiscan prevent the etch stop and facilitate the etching by preventing the rapid increase in surface temperature of the wafer and by improving an etching rate.

Figure 4:
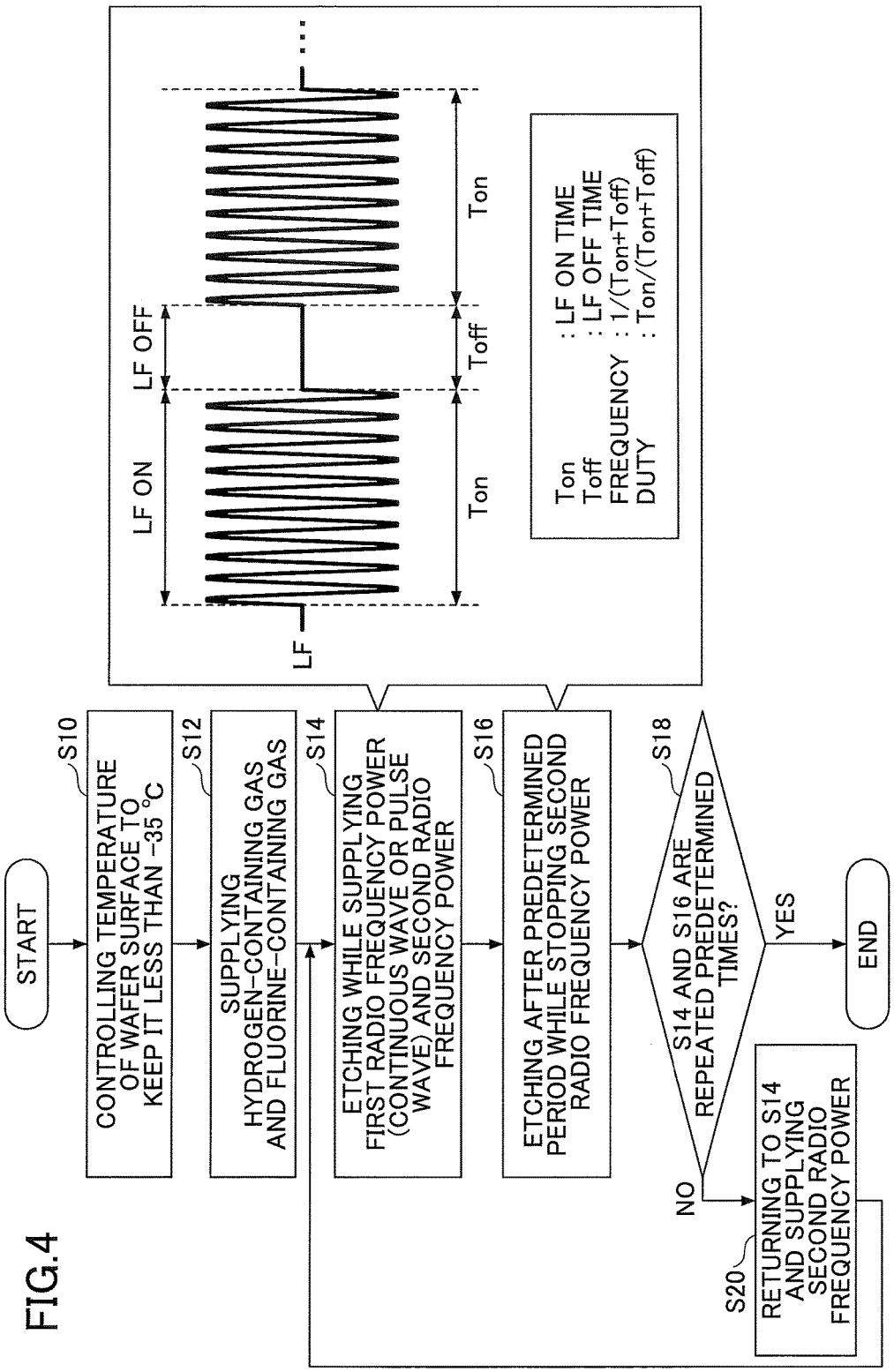
FIG. 4 is a flowchart illustrating an example of an etching method according to an embodiment of the present invention.

FIG. 4 illustrates an example of the etching method according to an embodiment. First, a temperature of a wafer surface is controlled to have an extremely low temperature lower than −35 degrees C. (step S10). Next, a hydrogen-containing gas and a fluorine-containing gas are supplied into the chamber 10 (step S12). For example, hydrogen gas ($H_2$) and carbon tetrafluoride are supplied into the chamber 10.

Next, the first radio frequency power source 32 is turned on and outputs first radio frequency power HF, and the radio frequency power for plasma excitation is supplied to the pedestal 20 (which may be referred to as an "on" state). Also, the second radio frequency power source 31 is turned on and outputs second radio frequency power LF, and the radio frequency power for bias is supplied to the pedestal 20. Thus, the silicon oxide film 6 is etched (step S14: first process). At this time, although the first radio frequency power HF may have any of continuous waves and pulse waves, the second radio frequency power LF has the pulse waves. Execution time for the first process (predetermined time) is preferably 30 seconds or shorter.

Subsequently, after the elapse of the predetermined time, the silicon oxide film 6 is etched while the supply of the second radio frequency power is stopped (off) (step S16: second process). The execution time for the second process is preferably 5 seconds or longer as described later. The pressure inside the chamber 10 when performing the second process may be in a low pressure state of 10 mT or lower.

As illustrated in FIG. 4, in the etching method according to the embodiment, the second radio frequency power is intermittently supplied to the pedestal 20 by repeating an on-off state of the second radio frequency power LF. At this time, a period of time when the second radio frequency LF is supplied (on time) is referred to as "Ton", and a period of time when the second radio frequency LF is not supplied (off time), is referred to as "Toff." In this case, the second radio frequency power having pulse waves of a frequency of 1/(Ton+Toff) is supplied to the pedestal 20. Furthermore, the duty cycle is expressed by a ratio of the on time Ton relative to the total period of time of the on time Ton and the off time Toff, which is Ton/(Ton +Toff).

Next, it is determined whether a number of repetitions of the on-off state of the second radio frequency power LF exceeds a predetermined number (step S18). The predetermined number is a preliminarily determined number more than one. When the number of repetitions of the on-off supply of second radio frequency power LF is determined not to be over the predetermined number, the second radio frequency power LF having the pulse waves is supplied again, and the silicon oxide film 6 is etched (step S20: first process). A series of processes of steps S16 through S20 is repeated until the number of repetitions exceeds the predetermined number, and the present process flow ends when the number of repetitions of the second radio frequency power LF is determined to be over the predetermined number.

Figure 5:
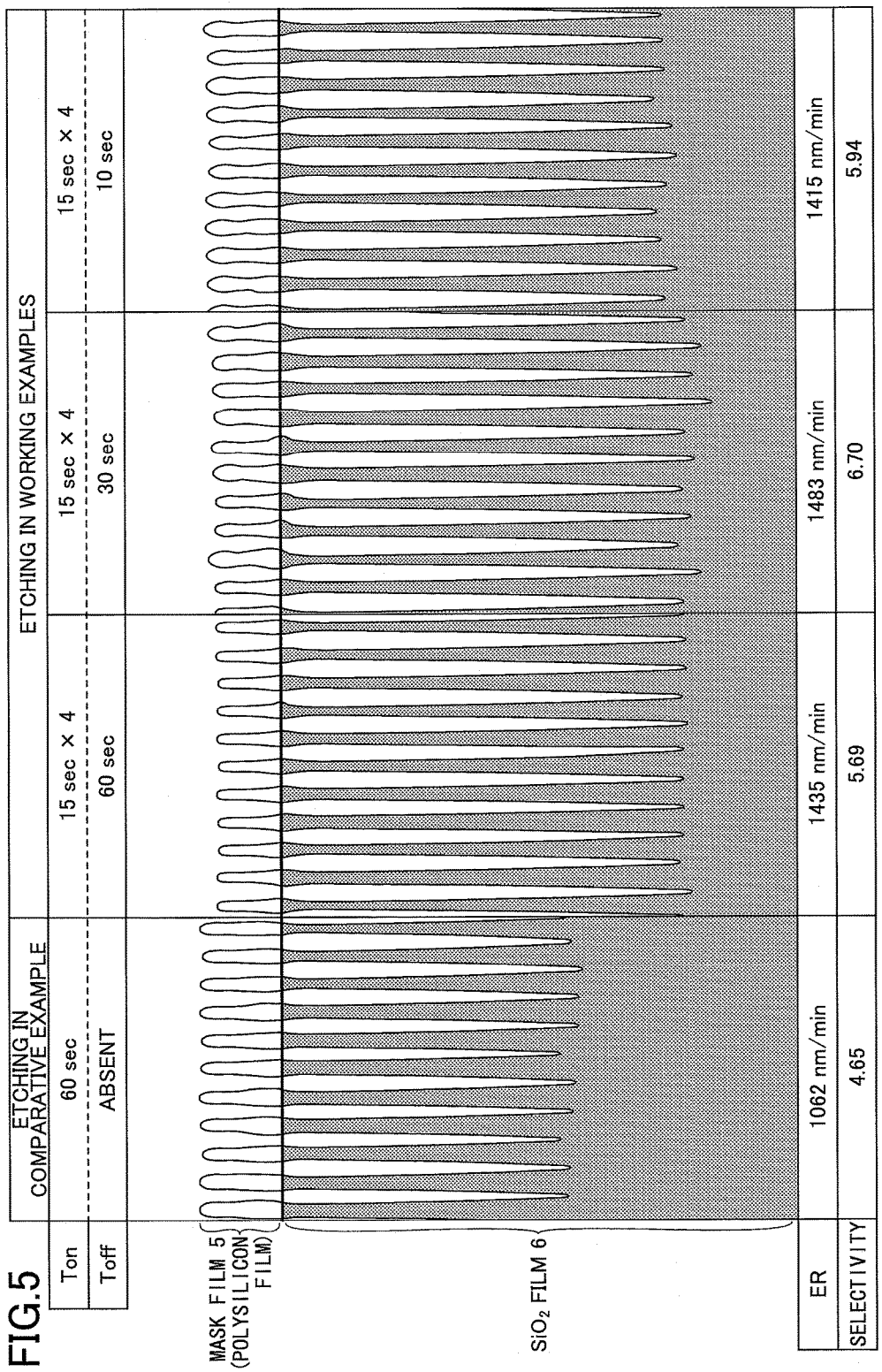
FIG. 5 is a diagram showing an example of an effect of turning off radio frequency power in an extremely low temperature etching according to an embodiment of the present invention.

FIG. 5 shows a result of an etching process of working examples of the etching method according to the embodiment. The leftmost column shows an etching result of a comparative example, and three columns on its right side show three etching results of the working examples.

Process conditions of the etching of the comparative example and the etching of the working examples according to the embodiment are in the following.

Process Conditions (Comparative Examples):
Temperature (setting temperature of the chiller 107) : −60 degrees C.
Pressure: 60 mT (8.00 Pa)
First Radio Frequency Power: 2500 W
Second Radio Frequency Power: 4000 W, 0.3 kHz, Duty Cycle 50%
Gas Types: Hydrogen ($H_2$)/Carbon Tetrafluoride ($CF_4$)
On Time: 60 seconds
Off Time: Absent.

Process Conditions (Working Examples):
Temperature (setting temperature of the chiller 107) : −60 degrees C.
Pressure: 60 mT (8.00 Pa)
First Radio Frequency Power: 2500 W
Second Radio Frequency Power: 4000 W, 0.3 kHz, Duty Cycle 50%
Gas Types: Hydrogen ($H_2$)/Carbon Tetrafluoride ($CF_4$)
On Time: 15 seconds (×4) (repeated four times)
Off Time: Present (60 seconds, 30 seconds, 15 seconds).

As a result, in the etching method according to the embodiment, the etching rate was about one-and-a-half times as high as the etching rate in the etching of the comparative example, and selectivity improved up to a value close to one-and-a-half as high as the selectivity of the comparative example. This is because the input heat from plasma decreased during the off time Toff and the increase in surface temperature of the wafer W during the on time can be reduced by regularly providing the off time of the second radio frequency power LF during the etching process according to the etching method of the embodiment. As a result, the surface temperature of the wafer was kept in the extremely low temperature state of a temperature lower than −35 degrees C.

Figure 6:
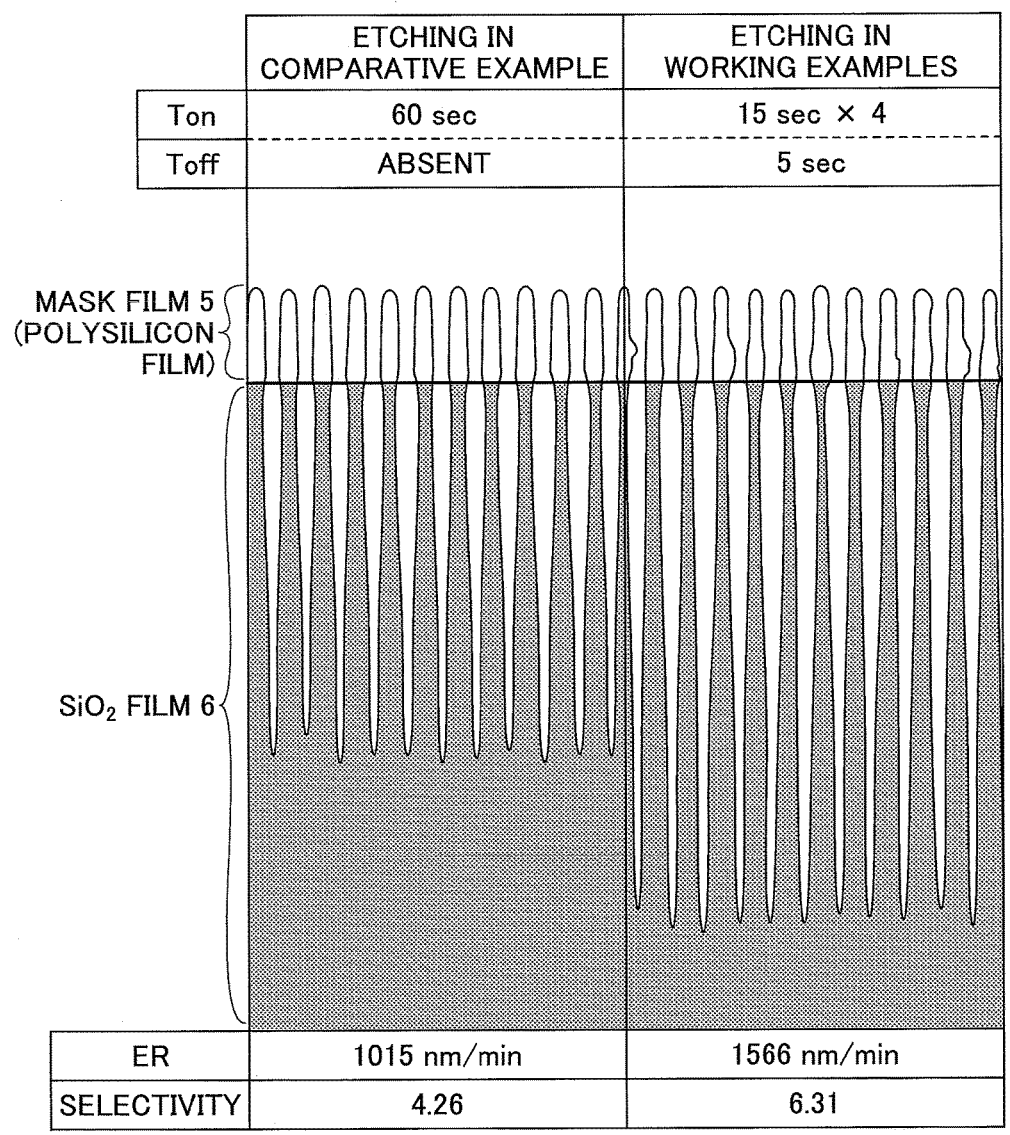
FIG. 6 is a diagram showing an example of turning off radio frequency power in an extremely low temperature etching according to an embodiment of the present invention.

FIG. 6 shows an etching result of a working example of having set the off time Toff at 5 seconds of the process conditions of the above-mentioned working examples. The process conditions other than the off time were the same. As a result, when the off time was set at 5 seconds, in the etching method of the working example, the etching rate and the selectivity further improved, and both of the etching rate and the selectivity were approximately one-and-a-half times as high as those of the comparative example.

Figure 7:
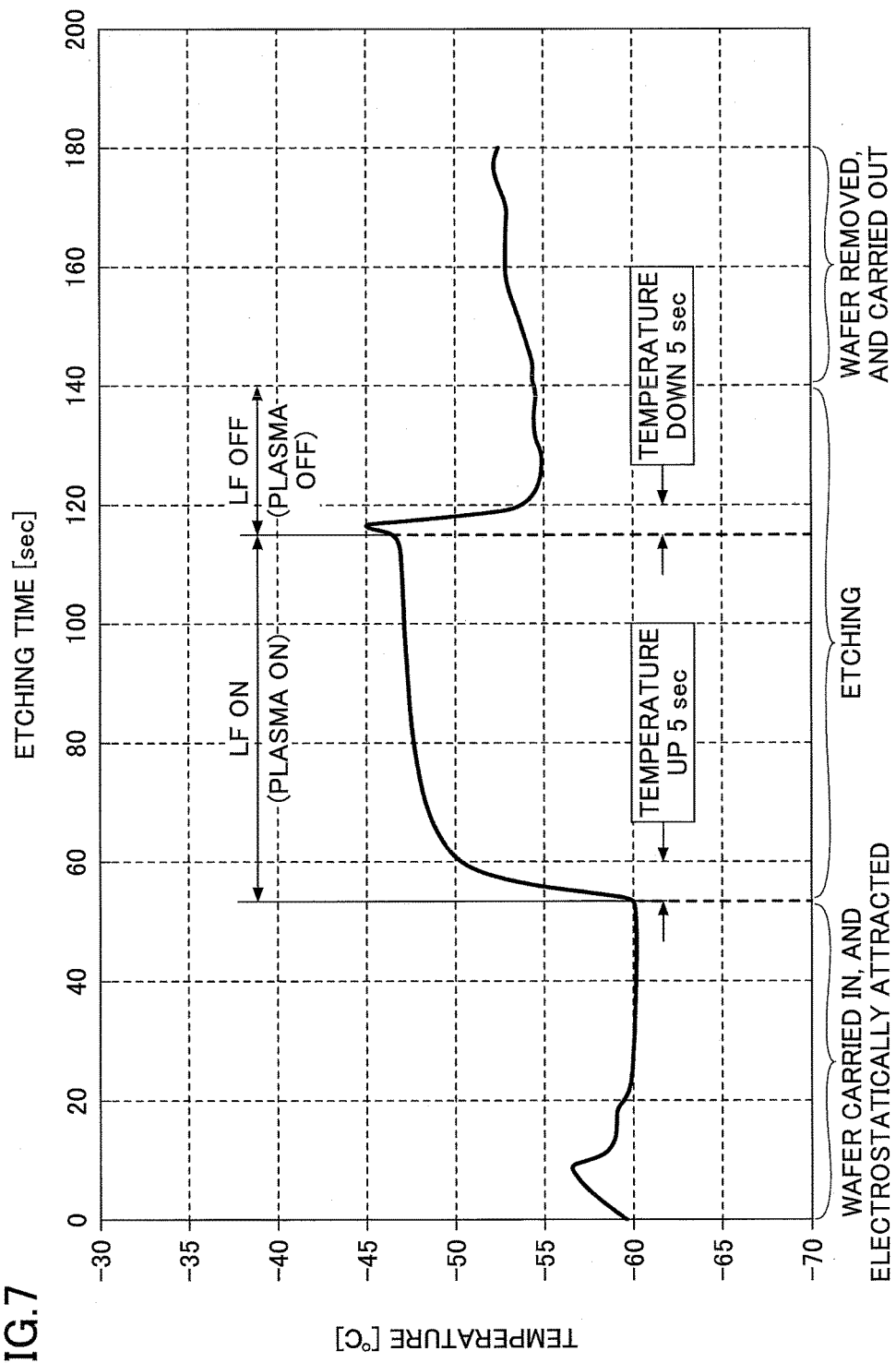
FIG. 7 is a graph showing an example of a temperature transition during an extremely low temperature etching according to an embodiment of the present invention.

FIG. 7 shows a surface temperature of a wafer W after the wafer W was carried into the etching apparatus 1 and then etched by the etching method of the working example and until the wafer W was carried out of the etching apparatus 1. When the first and second radio frequency power was supplied to the pedestal 20 while the wafer W was held on the electrostatic chuck 106, plasma was generated and an etching process started. When the plasma was generated by supplying the first frequency power and the second radio frequency power to the pedestal 20, the surface temperature of the wafer W sharply increased in 5 seconds due to the heat input from the plasma (plasma on), and then gently increased.

When the supply of the second radio frequency power was stopped during the etching, the surface temperature of the wafer W sharply decreased in 5 seconds. This is because an amount of the input heat from the plasma decreases. From the result, a period when the second radio frequency power LF is not supplied just has to be 5 seconds or more.

Based on the etching result shown in FIGS. 2A and 2B, the off time Toff of the second radio frequency power LF may be in a range from 5 to 60 seconds. However, considering throughput, the off time Toff of the second radio frequency power LF is preferably set at a short time. Hence, the off time Toff of the second radio frequency power is preferably set in a range of 5 to 30 seconds, and more preferably set in a range of 5 to 10 seconds.

In the temperature transition shown in FIG. 7, the supply of the second radio frequency power LF was stopped, the wafer W was carried out. Because of this, the surface temperature of the wafer W increased after the supply of the second radio frequency LF was stopped by turning off the second radio frequency power source 34. However, in the etching method according to the embodiment, an on-off of the second radio frequency power LF is repeated a plurality of times. Moreover, the on-off of the second radio frequency power LF is repeated the plurality of times (i.e., during the etching), and the supply of the refrigerant from the chiller 107 is not stopped. By doing this, the surface temperature of the wafer W can be maintained at the extremely low temperature lower than −35 degrees C. This causes the etching rate to be increased, and for example, the etching method according to the embodiment is preferable for a process of forming a narrow hole having an aspect ratio of 20 or higher by etching.

In the embodiment, the period of time for stopping the supply of the second radio frequency power LF having the pulse waves is provided in step S16 of FIG. 4. Instead of this, a period of time for stopping the supply of the first radio frequency power HF and the supply of the second radio frequency power LF together may be provided. By doing this, during the off time of the first radio frequency power HF and the second radio frequency power LF, the surface temperature of the wafer W can be maintained at an extremely low temperature by decreasing the heat input from the plasma, thereby increasing the etching rate and facilitating the etching.

Figure 8:
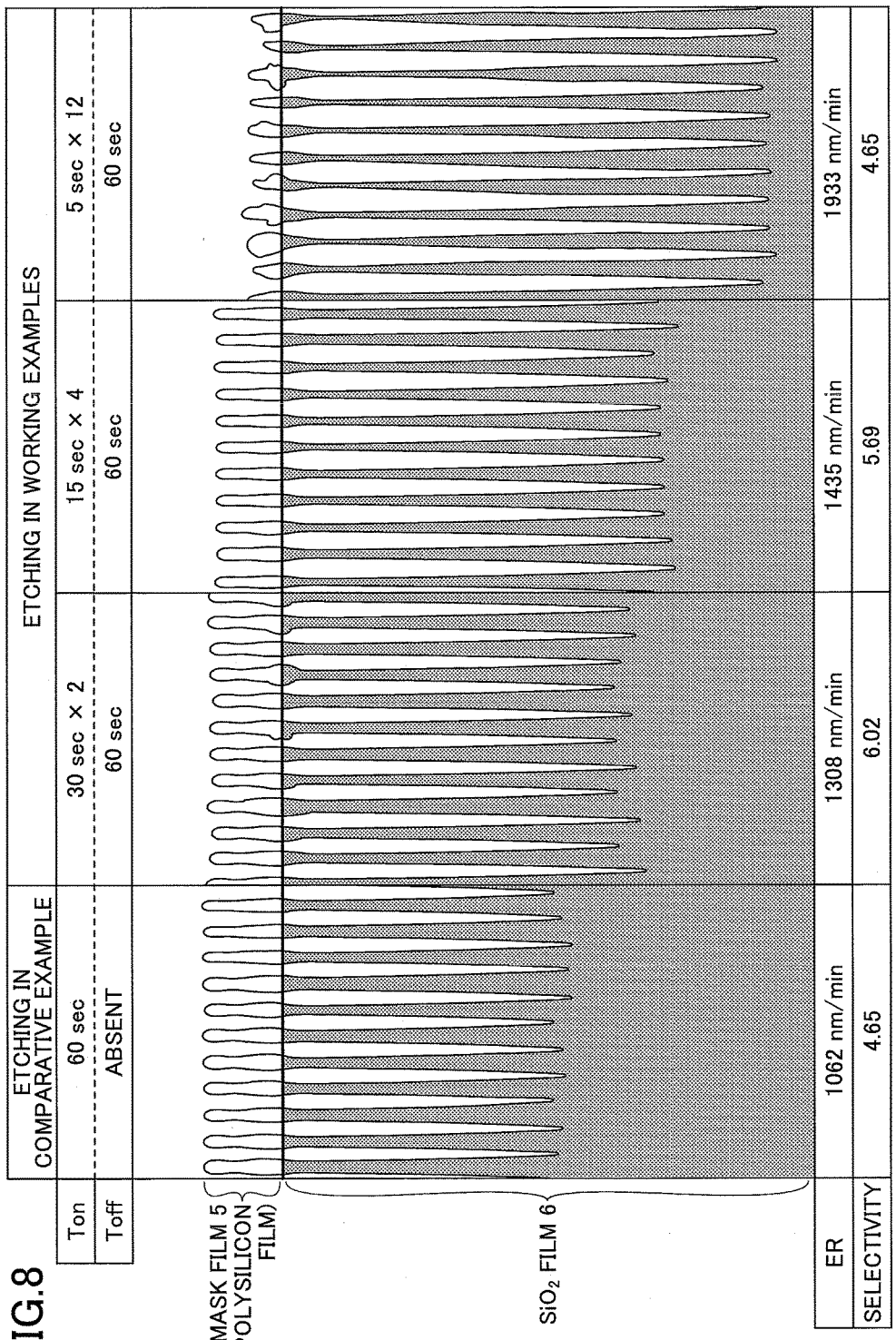
FIG. 8 is a diagram showing an example of an effect of repetition in an extremely low temperature according to an embodiment of the present invention.

FIG. 8 shows etching results of working examples according to the etching methods of the embodiment when changing a single on time Ton in the process conditions, with an etching result of a comparative example performed under process conditions of the comparative example (i.e., without the off time Toff). In the etching of the working examples, the off time Toff was set at 60 seconds, and the on time Ton was set at 30 seconds (×2), 15 seconds (×4), and 5 seconds (×12). The etching results thereof are shown in FIG. 8. From the results, it is noted that the etching rate and the selectivity of any of the working examples were better than the etching result of the comparative example, and in particular, that the etching was facilitated with increasing number of on-off repetitions.

Figure 9:
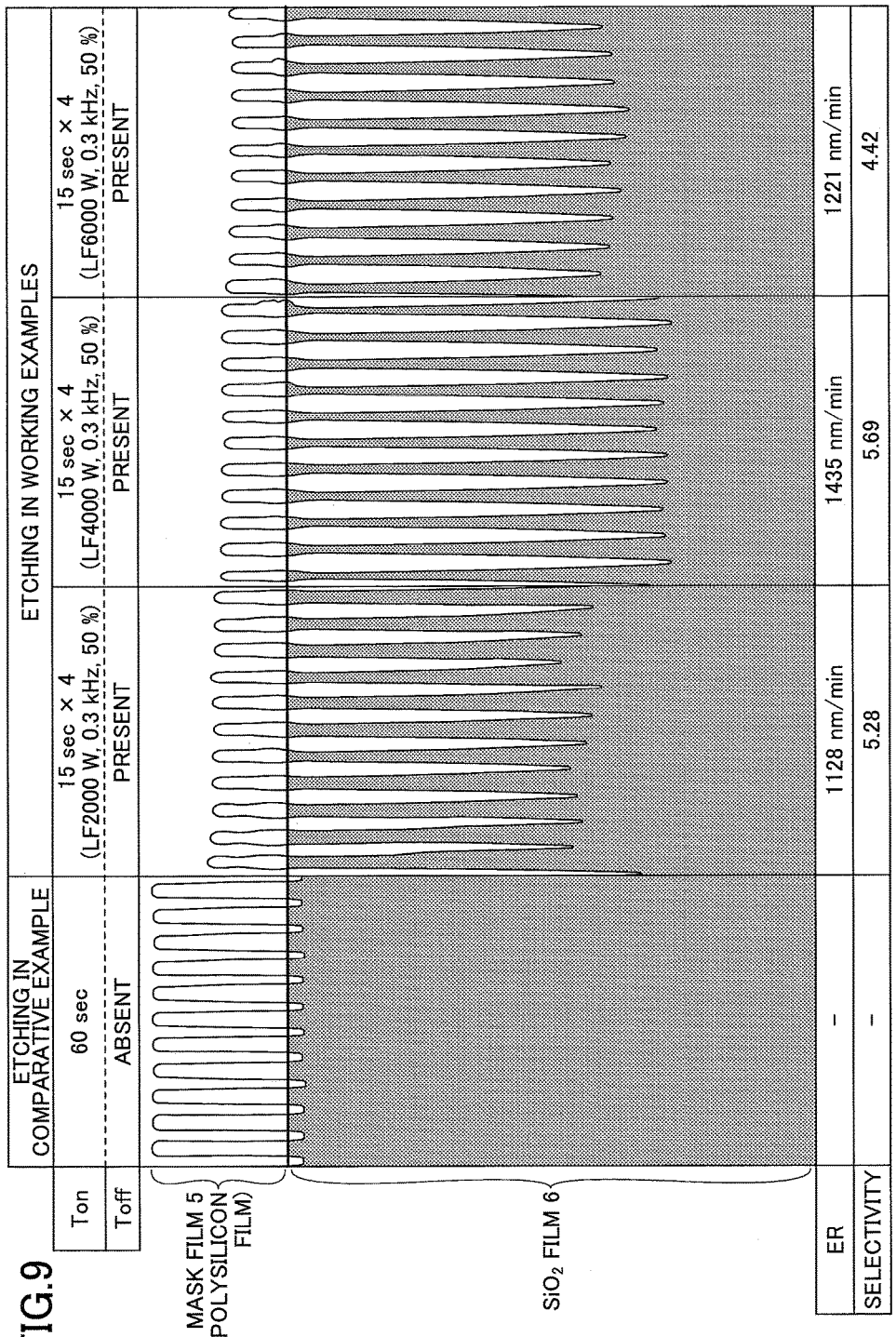
FIG. 9 is a diagram showing an example of an effect of radio frequency power in an extremely low temperature etching according to an embodiment of the present invention.

FIG. 9 shows etching results of working examples according to the etching method of the embodiment when changing an effective value of the second radio frequency power LF during the on time Ton among the process conditions, with an etching result of a comparative example performed under process conditions of the comparative example (i.e., without the off time Toff). In the working examples, the off time Toff was set at 30 seconds; the on time Ton was set at 15 seconds (×4); and the second radio frequency power LF was set at 2000 W (0.3 kHz, duty cycle 50%), 4000 W (0.3 kHz, duty cycle 50%), and 6000 W (0.3 kHz, duty cycle 50%). The results indicate that the etching rate and the selectivity of any of the working examples according to the etching method of the embodiment were better than those of the comparative example without generating the etch stop. From the results, because an effective value of the second radio frequency power LF of 2000 W (0.3 kHz, duty cycle of 50%) is 1000 W, the effective value of the second radio frequency power LF is preferably higher than or equal to 1000 W (higher than or equal to 1.4 W/cm² per unit area).

As discussed above, in the etching method according to the embodiment, by intermittently providing a period of time for stopping the supply of the second radio frequency power LF at each predetermined time interval during the etching, the surface temperature of the wafer W can be reduced and kept at an extremely low temperature. Thus, the etching rate and the selectivity can be improved. Moreover, even in an area of the second radio frequency power LF where the etch stop occurs during the etching when the off time of the second radio frequency power LF is not provided, the etching can be facilitated in the extremely low temperature by intermittently providing the off time of the second radio frequency power LF.

(Amount of Drawn Heat Caused by Cooling)

The chiller 107 circulates the refrigerant that is constantly controlled to have an extremely low temperature through the pedestal 20 during the etching. Accordingly, the heat is constantly drawn away from the surface of the wafer W during the etching. At this time, a total of an amount of the drawn heat (total amount of drawn heat) is calculated by multiplying an amount of drawn heat per unit area by a period of time.

In the etching method according to the embodiment, when the total amount of drawn heat while stopping the output of the second radio frequency power LF, is greater than or equal to 71.7 kW/m² ×5 seconds, the total amount of drawn heat is sufficient. In the calculation of the amount of drawn heat, drawn heat performance of the chiller 107 is 5000 Ws, and a diameter of the pedestal 20 is 298 mm. In other words, the amount of drawn heat per unit area while stopping the output of the second radio frequency power LF, just has to be less than or equal to 71.7 kw/m² (7.17 W/cm²). Here, when the outputs from the first radio frequency power source 32 and the second radio frequency power source 34 are intermittently stopped, the amount of drawn heat per unit area while stopping the outputs from the first radio frequency power source 32 and the second radio frequency power source 34 just has to be 71.7 kW/m² (7.17 W/cm²) or lower per second.

As described above, according to the etching method of the embodiment, the etching rate can be enhanced, and the etching can be facilitated by setting the surface temperature of the wafer W at a temperature lower than or equal to −35 degrees C., by intermittently supplying the radio frequency power during the etching under the extremely low temperature environment. Furthermore, according to the etching method of the embodiment, by intermittently supplying the radio frequency power to the pedestal 20 during the etching under the extremely low temperature environment, the etching under the extremely low temperature can be performed without causing the etch stop, and a process window can be broadened. Thus, the etching method according to the embodiment is preferably applied to the case where a hole having an aspect ratio higher than or equal to 20 is intended to be etched more deeply, the case where a narrower hole is intended be etched and the like.

[Temperature Control]

Figure 10:
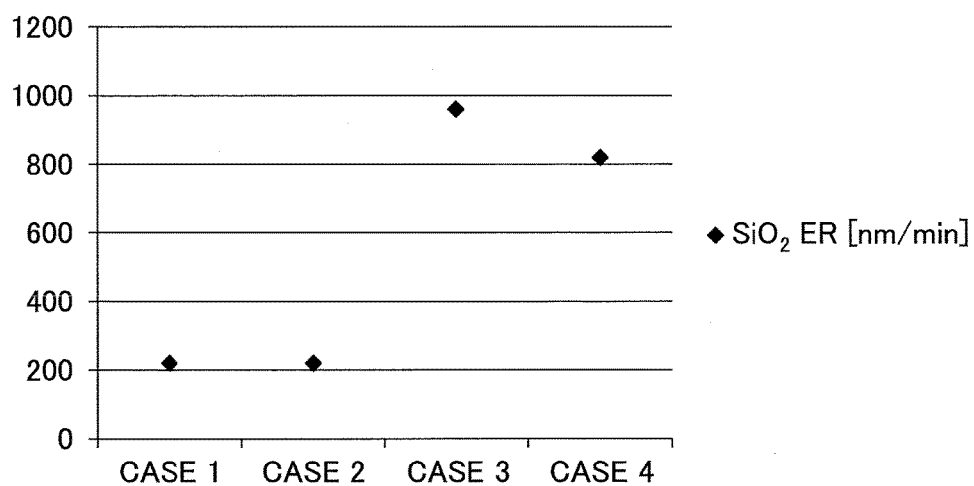
FIG. 10 is a graph showing an example of a relationship between a temperature of a chamber and an etching rate ER in an extremely low temperature etching according to an embodiment of the present invention.

In the above-described etching method according to the embodiment, a very high etching rate ER can be achieved under the extremely low temperature environment in which the surface temperature of the wafer W is lower than −35 degrees C. In other words, the temperature control of the surface of the wafer W is very important. For example, FIG. 10 shows a relationship between a temperature of the chamber 10 and an etching rate ER of a silicon oxide film of working examples according to the extremely low temperature etching method. Etching results shown in FIG. 10 are results of the etching of a silicon-containing antireflection film under the following process conditions. The horizontal axis of FIG. 10 shows process conditions of the wafer W (cases 1 through 4), and the vertical axis shows an etching rate (ER) at a central portion of the wafer W with a diameter of 300 mm.

Process Conditions:
Temperature (setting temperature of the chiller 107) : −60 degrees C.
Pressure: 60 mT (8.00 Pa)
First Radio Frequency Power HF: 2500 W
Second Radio Frequency Power LF: 4000 W, pulse wave of duty cycle 50% (effective value 2000 W)
Gas Types: Hydrogen ($H_2$)/Tetrafluoride ($CF_4$).

In the above process conditions, Case 1 and Case 2 in FIG. 10 were cases where He gas (heat transfer gas) supplied to the back surface of the wafer W was controlled to have a pressure of 50 T (6666 Pa), and Case 3 and Case 4 in FIG. 10 were cases where the pressure of He gas was controlled to have a pressure of 80 T (10666 Pa). Furthermore, in Case 1 and Case 3 of FIG. 10, a temperature of a ceiling plate constituting the gas shower head 25 was set at 30 degrees C., and a side wall of the chamber 10 was set at 40 degrees C. In this case, when the pressure of He gas was set at 80 T, a cooling effect of the back surface of the wafer W by He gas was more increased than when the pressure of He gas was set at 50 T, and the temperature of the wafer W could be maintained at an extremely low temperature, thereby increasing the etching rate.

In Case 2 and Case 4 of FIG. 10, the temperature of the ceiling plate constituting the gas shower head 25 was set at 150 degrees C., and the temperature of the side wall of the chamber 10 was set at 150 degrees C. Even in this case, similarly to Case 1 and Case 3, when the pressure of He gas was set at 80 T, the cooling effect of the back surface of the wafer W by He gas was more increased than when the pressure of He gas was set at 50 T, and the temperature of the wafer W could be maintained at an extremely low temperature, thereby increasing the etching rate.

In other words, the temperature control of the surface of the wafer W is very important under the extremely low temperature environment, and it is noted that controlling the surface temperature of the wafer W to have a temperature lower than −35 degrees C. has a great impact on the etching rate compared to the etching under the room temperature environment.

Moreover, in addition to the cooling effect by the heat transfer gas such as He gas, the heat input to the wafer W from the plasma can be controlled by changing a parameter on the heat input side. This also makes it possible to set the surface temperature of the wafer W at an extremely low temperature and to increase the etching rate.

Figure 11:
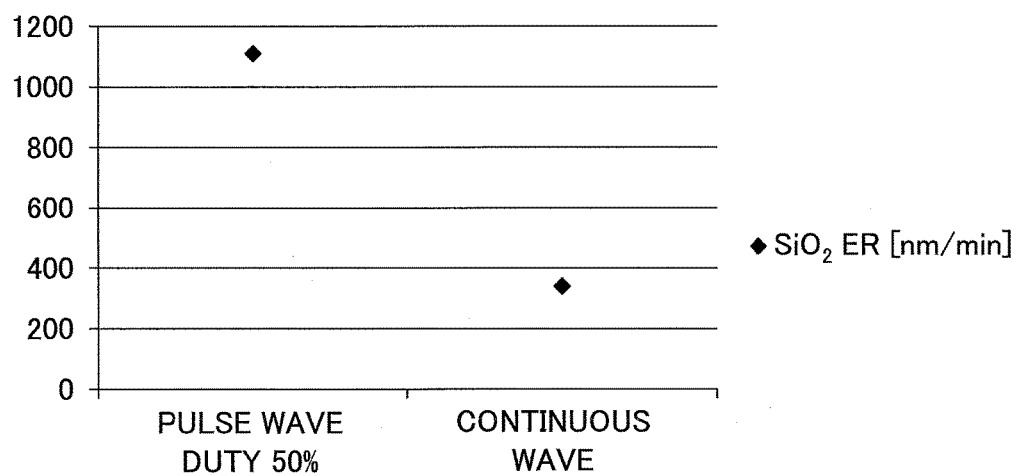
FIG. 11 is a graph showing an example of a relationship between radio frequency power and an etching rate ER in an extremely low temperature etching according to an embodiment of the present invention.

For example, FIG. 11 shows a relationship between control of the second radio frequency power LF and the etching rate ER of a working example in the etching method according to the embodiment. The etching results shown in FIG. 11 were result of the etching of the silicon-containing antireflection film under the following process conditions. The horizontal axis in FIG>11 shows process conditions of the wafer W, and the vertical axis shows an etching rate (ER) at a central portion of the wafer W of a diameter of 300 mm.

Process Conditions:
Temperature (setting temperature of chiller 107): −70 degrees C.
Pressure: 60 mT (8.00 Pa)
First Radio Frequency Power HF: 2500 W
Second Radio Frequency Power LF: as shown in FIGS. 2A and 2B (pulse wave, continuous wave)
Gas Types: Hydrogen ($H_2$)/Tetrafluoride ($CF_4$).

On the left side of FIG. 11, the second radio frequency power LF had pulse waves of 4000 W and a duty cycle thereof was controlled to become 50%. Hence, the effective value of the second radio frequency power LF on the left side of FIG. 11 was 2000 W. On the right side of FIG. 11, the second radio frequency power LF had continuous waves of 4000 W. Accordingly, the effective value of the second radio frequency power LF on the right side was 4000 W.

With reference to each of the plotted points, the etching rate on the left side obtained by intermittently supplying the second radio frequency power LF and by decreasing the surface temperature of the wafer W by limiting the heat input from the plasma while stopping the supply of the second radio frequency power LF, was greatly higher than the etching rate on the right side.

As discussed above, the cooling effect of the back surface of the wafer W can be increased by controlling the pressure of He gas, and by controlling the on-off state of the second radio frequency power source 34. This allows the surface temperature of the wafer W to be maintained at a temperature lower than −35 degrees C., thereby increasing the etching rate and the productivity.

[Temperature Control Unit]

Figure 12:
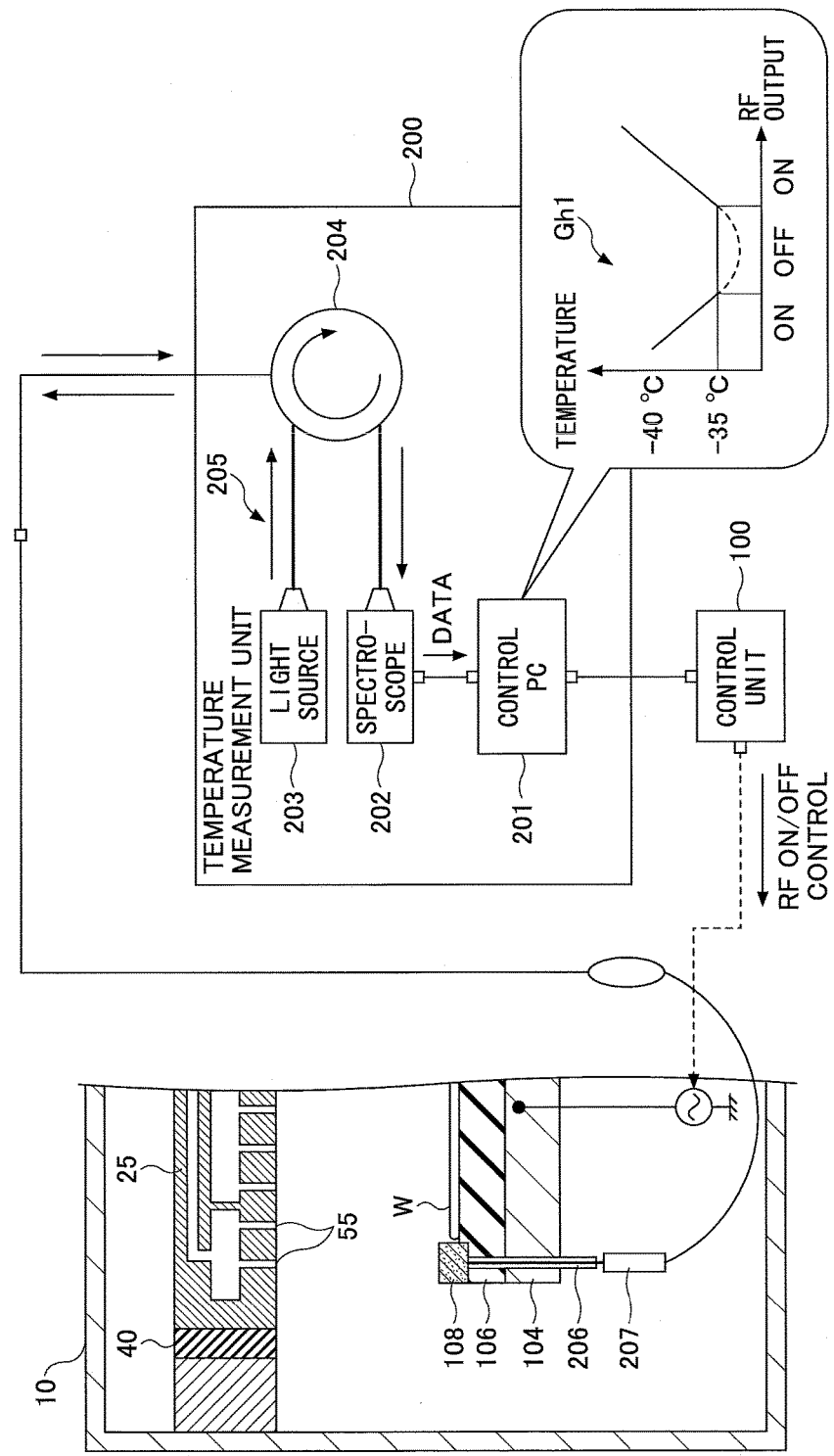
FIG. 12 is a diagram illustrating an example of a configuration of a temperature control unit according to an embodiment of the present invention.

As illustrated in FIG. 12, a temperature measurement unit 200 in an embodiment includes a control PC 201 configured to measure a temperature of the focus ring 108 of the etching apparatus 1, and to control a surface temperature of a wafer W in real time based on the temperature measurement result. The control PC 201 is an example of a monitor mechanism to monitor the surface temperature of the wafer W in real time. At this time, the control PC 201 controls the surface temperature of the wafer W based on the result of the temperature measurement of the focus ring 108.

Moreover, the temperature measurement unit 200 includes a temperature measurement mechanism 205. The temperature measurement mechanism 205 measures the temperature of the focus ring 108. By citing an interferometer type thermometer illustrated in FIG. 13 as an example of the temperature measurement mechanism 205, a temperature measurement method of the focus ring 108 is described below. However, as long as the temperature measurement mechanism 205 can measure the temperature of the focus ring 108, instead of the interferometer type thermometer, any known temperature can be used as the temperature measurement mechanism 205.

The temperature measurement mechanism 205 includes a spectroscope 202, a light source 203, a circulator 204, and a collimator 207. As illustrated in FIG. 12, a tip of an optical fiber 206 is provided under the focus ring 108 of the etching apparatus 1 so as to be in close contact with the focus ring 108 by being buried in the pedestal 20. The optical fiber 206 is directly connected to the temperature measurement mechanism 205 through the collimator 207.

Figure 13:
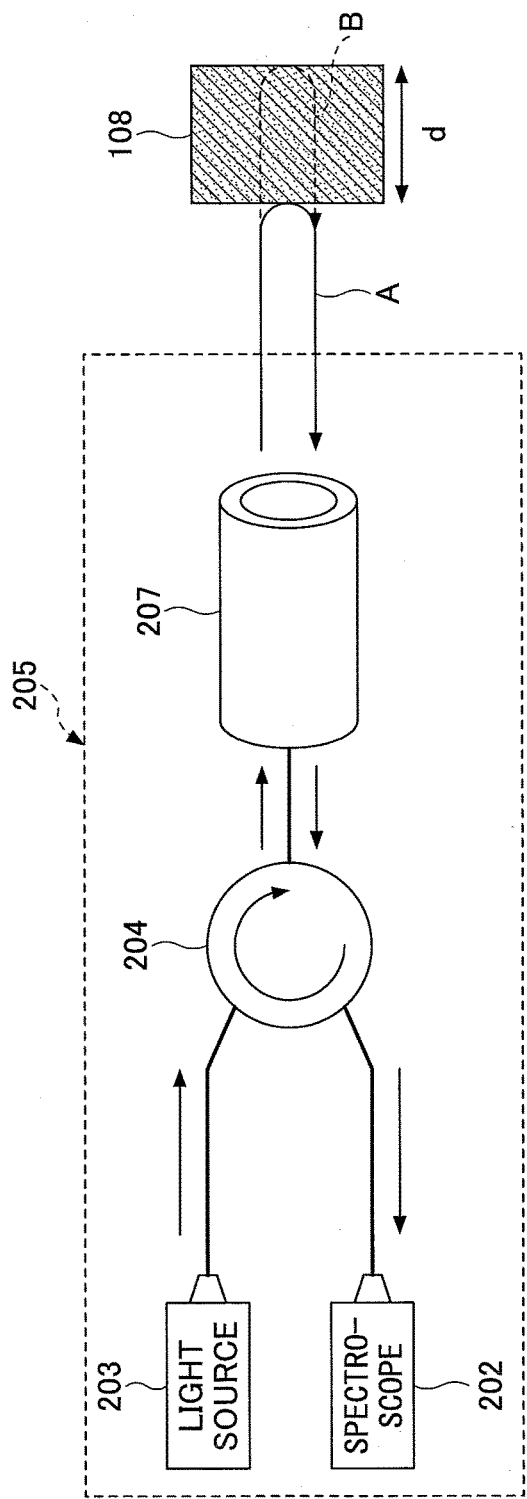
FIG. 13 is a schematic diagram illustrating an example of an interferometric thermometer according to an embodiment of the present invention.

As illustrated in FIG. 13, the temperature measurement mechanism 205 measures the temperature of the focus ring 108 made of silicon (Si) with refractive index of n. The focus ring 108 of a measurement object has a first principal surface corresponding to the back surface of the focus ring 108 and a second principal surface corresponding to the top surface of the focus ring 108.

First, the light source 203 emits spectral light with a wavelength of 1560 nm. The light source 203 is a light source of measurement light that penetrates through the focus ring 108. The measurement light of 1560 nm emitted from the light source 203 is input to the collimator 207 through the circulator 204, converged and emitted from an output end of the optical fiber 206 toward the focus ring 108. First reflected light A of the measurement light reflected from the first principal surface and second reflected light B of the measurement light reflected from the second principal surface after passing through the focus ring 108 enter the collimator 207. The first reflected light A and the second reflected light B having entered the collimator 207 is transmitted to the spectroscope 202 by way of the circulator 204. Returning to FIG. 12, the control PC 201 is connected to the spectroscope 202. The control PC 201 measures the temperature of the focus ring 108 based on a waveform obtained by Fourier transform of interference intensity distribution between the first reflected light A and the second reflected light B transferred from the spectroscope 202.

In this manner, in the embodiment, the temperature of the focus ring 108 is measured by using the temperature measurement mechanism 205, and a temperature of the pedestal 20 holding the wafer W thereon is not directly measured. This is because when a temperature of the back surface of the pedestal 20 is directly measured, the measurement value of the back surface of the pedestal 20 does not indicate an actual surface temperature of the wafer W and accurate temperature control of the wafer W becomes difficult due to a predetermined distance provided between the pedestal 20 and the wafer W. Moreover, when the temperature measurement is performed at the back surface of the pedestal 20, the temperature measurement is likely to be influenced by the heat input from the plasma generated above the wafer W and by an electrical impact from the electrostatic chuck 106, which is likely to prevent the accurate measurement of the surface temperature of the wafer W. From these reasons, the temperature measurement unit 200 measures the temperature of the focus ring 108, thereby estimating the surface temperature of the wafer W based on the measurement result.

On this occasion, the etching apparatus 1 includes a cooling mechanism that cools the focus ring 108 and an attraction mechanism that attracts the focus ring 108 on the electrostatic chuck 106 to be able to accurately estimate the surface temperature of the wafer W from the measurement temperature of the focus ring 108. These functions are specifically described below with reference to FIGS. 14A and 14B.

Figure 14A:
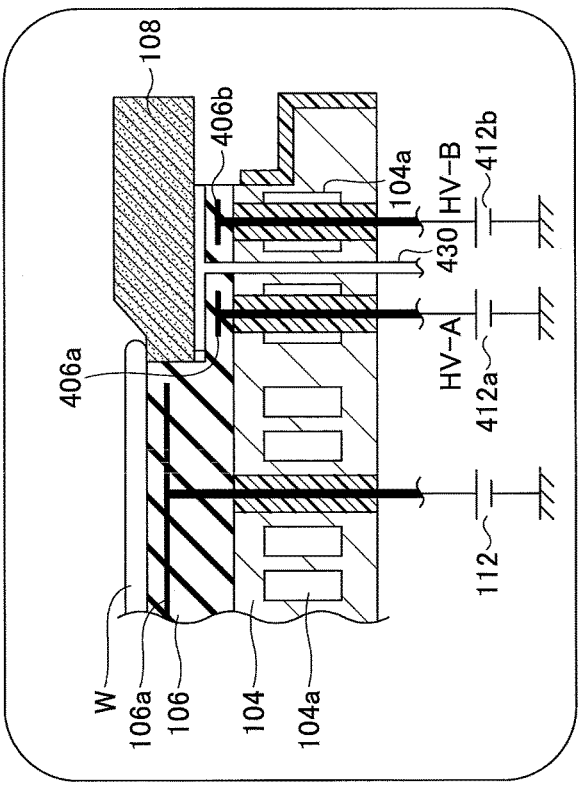
FIGS. 14A and 14B are diagrams illustrating an example of a temperature adjustment mechanism according to an embodiment of the present invention.

FIG. 14A illustrates an example of a conventional electrostatic chuck 106, a focus ring 108, and a neighboring portion thereof. In the example of FIG. 14A, an intermediary body 310 to be in close contact with the electrostatic chuck 106 and the focus ring 108 through heat transmission sheets 300 is provided between the electrostatic chuck 106 and the focus ring 108. This causes the electrostatic chuck 106 to be thermally separated from the focus ring 108. As a result, in a configuration example as illustrated in FIG. 14A, it is difficult to accurately estimate the surface temperature of the wafer W from the measured temperature of the focus ring 108.

Figure 14B:
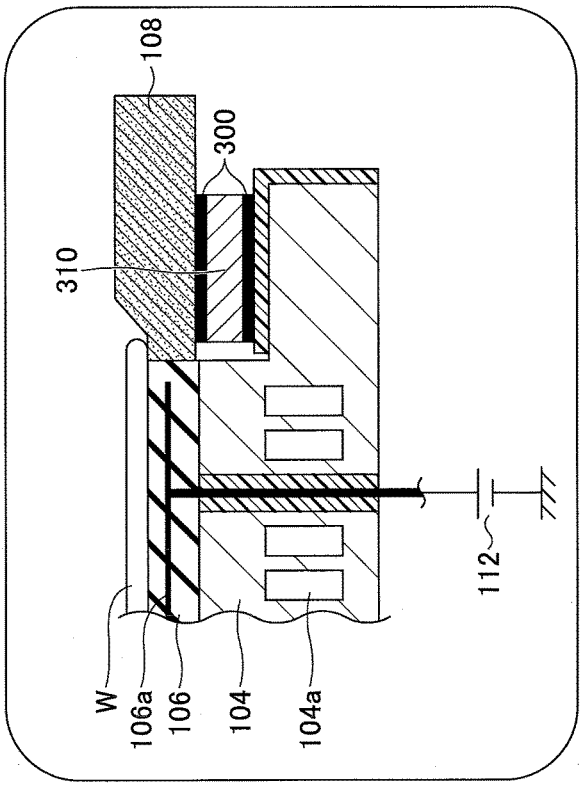

In contrast, FIG. 14B illustrates the electrostatic chuck 106, the focus ring 108 and a neighboring portion thereof of the etching apparatus 1 according to the embodiment. In the etching apparatus 1 according to the embodiment, the intermediary body 310 and the heat transmission sheets 310 are not provided between the focus ring 108 and the electrostatic chuck 106, and the focus ring 108 and the electrostatic chuck 106 are directly in contact with each other.

In addition, chuck electrodes 406a and 406b are provided inside the electrostatic chuck 106 under the focus ring 108. A direct voltage source 412a is connected to the chuck electrode 406a, and the direct voltage source 412a applies a direct voltage HV-A to the chuck electrode 406a. Similarly, a direct voltage source 412b is connected to the chuck electrode 406b, and the direct voltage source 412b applies a direct voltage HV-B to the chuck electrode 406b. Thus, the focus ring 108 is attracted on the electrostatic chuck 106 by Coulomb's force.

Furthermore, in the etching apparatus 1 according to the embodiment, a gas supply line 430 is provided to supply a heat transfer gas such as helium (He) gas or argon (Ar) gas to the back surface of the focus ring 108. The heat transfer gas supply source 85 illustrated in FIG. 1 is connected to the gas supply line 430. Thus, the back surface of the focus ring 108 is cooled by the heat transfer gas similar to the back surface of the wafer W. Also, the back surface of the focus ring 108 is cooled by a refrigerant flow passage 104a similar to the back surface of the wafer W.

Because the etching apparatus 1 having such a configuration includes a structure for cooling the back surface of the focus ring 108 and the back surface of the wafer W under the same environment, the heat drawing performance of the focus ring 108 and the pedestal 20 against the heat input from the plasma during the etching can be made the same as each other. Hence, by measuring the temperature of the focus ring 108, the surface temperature of the wafer W can be accurately estimated based on conditions including a material and a structure of the pedestal 20, a structure of the refrigerant flow passage 104a, and a temperature of the refrigerant. Thus, by measuring the temperature of the focus ring 108 in real time, the surface temperature of the wafer W can be monitored in real time.

Here, the mechanism of supplying the refrigerant to the refrigerant flow passage 104a from the chiller 107, and the mechanism of supplying the heat transfer gas from the heat transfer gas source 85 through the gas supply lines 130 and 430 to the back surface of the wafer W and the focus ring 108 are an example of a temperature control mechanism provided in the pedestal 20. The temperature measurement unit 200 adjusts the surface temperature of the wafer W by using on-off control of the temperature control mechanism and the radio frequency power RF.

More specifically, the control PC 201 in FIG. 12 acquires the temperature of the focus ring 108 at each predetermined time interval in real time. Then, the control PC 201 controls the on-off state of the radio frequency power RF from the acquired temperature information of the focus ring 108 in real time, based on a relational graph Gh1, which is preliminarily stored in the memory unit such as the ROM 110, between the output of the radio frequency power RF and the temperature of the wafer W as illustrated in FIG. 12. For example, when a temperature indicated.by the acquired temperature information is higher than −35 degrees C., the control PC 201 determines that the surface temperature of the wafer W is not in the extremely low temperature state, and outputs a signal to cause the control unit 100 to stop the supply of the radio frequency power RF in order to stop the supply of the radio frequency power RF. The control unit 100 performs feedback control of stopping the supply of the radio frequency power RF based on the signal sent from the control PC 201.

In addition, for example, when the temperature indicated by the acquired temperature information is lower than −35 degrees C., the control PC 201 determines that the surface temperature of the wafer W is in the extremely low temperature state, and outputs a signal to cause the control unit 100 to supply the radio frequency power RF in order to supply the radio frequency power RF. The control unit 100 performs feedback control of supplying the radio frequency power RF based on the signal sent from the control PC 201. Thus, by supplying the radio frequency power RF having pulse waves based on the measured temperature of the focus ring 108 in real time, the surface temperature of the wafer W can be maintained at an extremely low temperature that is lower than −35 degrees C.

The control PC 201 may control only the on-off state of the output of the second radio frequency power 34 as the radio frequency power RF, or may control the on-off state of the output of the first radio frequency power source 32 and the second radio frequency power source 34 in synchronization with each other.

As described above, the temperature measurement unit 200 performs the feedback control to keep the surface temperature of the wafer W less than −35 degrees C. by stopping the output of the second radio frequency power source 34 or the outputs of the first radio frequency power source 32 and the second radio frequency power source 34 based on the measured temperature of the focus ring 108. The above-described feedback function according to the embodiment allows the surface temperature of the wafer W to be maintained at the extremely low temperature. In particular, the etching apparatus 1 according to the embodiment includes the temperature control mechanism (cooling mechanism and heat transfer mechanism) as illustrated in FIG. 14 under the focus ring 108 in order to control the temperature of an edge portion of the wafer W. This enables the focus ring 108 and the pedestal 20 to have the same heat drawing performance. Accordingly, by measuring the temperature of the focus ring 108, the surface temperature of the wafer W can be precisely estimated. Thus, by measuring the temperature of the focus ring 108, the feedback control can be performed so that the surface temperature of the wafer W is maintained at the extremely low temperature that is lower than −35 degrees C.

Furthermore, in the embodiment, by measuring the temperature of the focus ring 108, the feedback control of the pressure of the heat transfer gas can be performed so that the surface temperature of the wafer W is maintained at the extremely low temperature that is lower than −35 degrees C.

Figure 15:
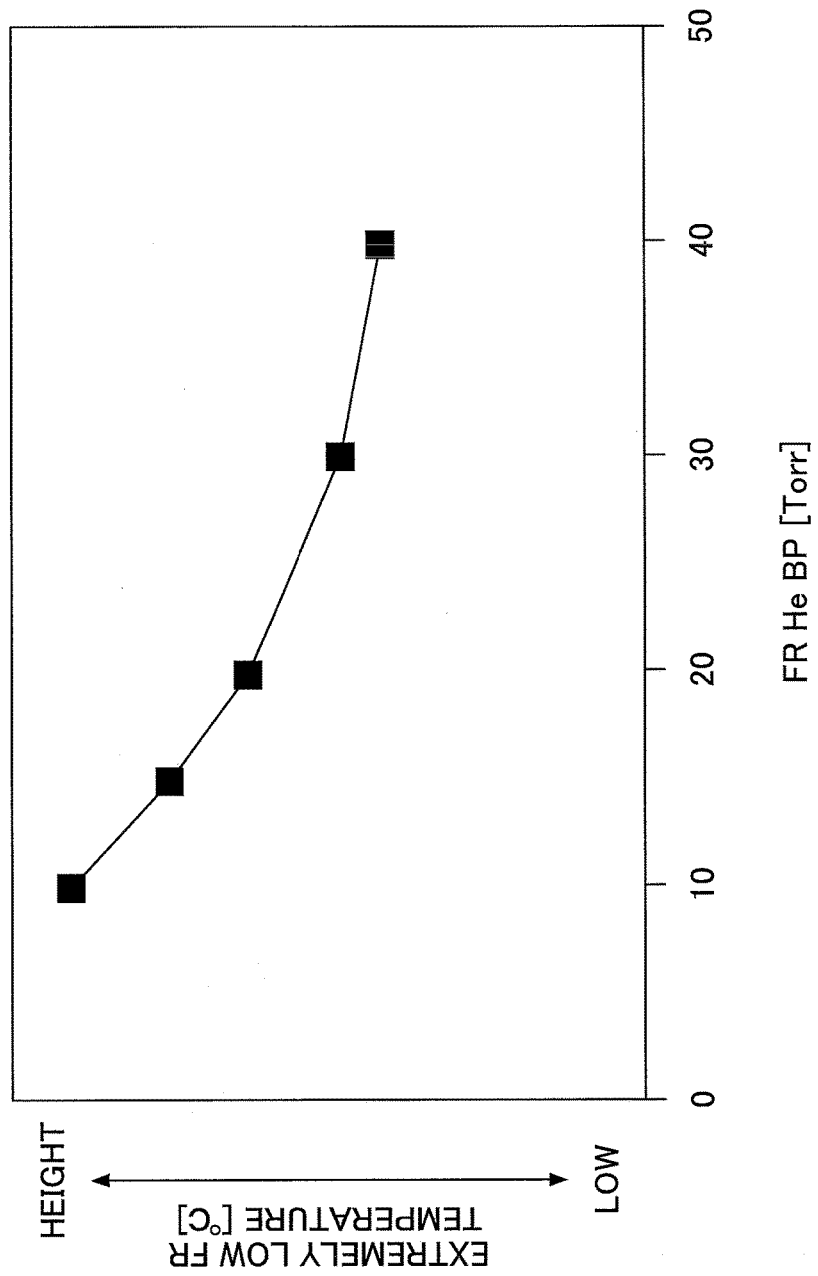
FIG. 15 is a graph showing an example of a relationship between a pressure of a heat transfer gas and a temperature of a focus ring in an extremely low temperature etching according to an embodiment of the present invention.

FIG. 15 shows a relationship between a heat transfer gas and a temperature of the focus ring 108 in an extremely low temperature of a working example according to the embodiment. The horizontal axis in FIG. 15 shows a pressure of He gas(FR He BP) when He gas is supplied to the back surface of the focus ring 108 as a heat transfer gas. The vertical axis in FIG. 15 shows a temperature of the focus ring 108. According to the result, it is noted that the pressure of He gas and the temperature of the focus ring 108 have a relation of a graph shown in FIG. 15 in the extremely low temperature environment.

Figure 16:
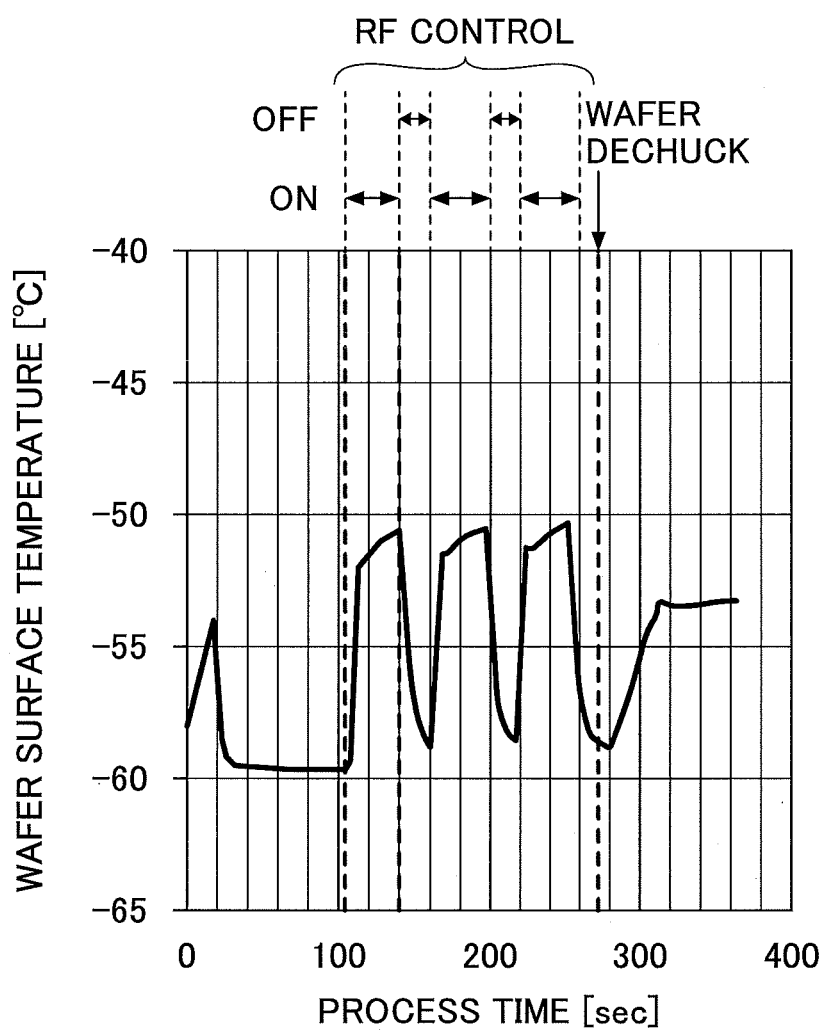
FIG. 16 is a graph showing an example of a relationship between an intermittent etching and a temperature of a wafer according to an embodiment of the present invention.

FIG. 16 shows a result of feedback control by the control PC 201 of a working example. According to the result, by repeating the on-off state of the radio frequency power RF, the surface temperature of the wafer W increasing while the radio frequency power RF is supplied is decreased while the radio frequency power RF is not supplied. Thus, the surface temperature of the wafer W can be maintained at the extremely low temperature that is lower than −35 degrees C.

Because the on-off control of the radio frequency poser RF and the pressure control of the heat transfer gas are performed in real time depending on the temperature measurement of the focus ring during the etching, temperature controllability is high. Hence, according to the etching apparatus 1 of the embodiments, by measuring the temperature of the focus ring 108, autonomous control of both of the on-off control of the radio frequency power RF and the pressure control of the heat transfer gas can be performed in real time. As a result, a high etching rate can be achieved by maintaining the surface temperature of the wafer W at the extremely low temperature that is lower than −35 degrees C., thereby improving the productivity.

Here, the control PC 201 may control at least one of the pressure control of He gas and the on-off control of the radio frequency power RF. For example, the control PC 201 may control the stop of the output of the first radio frequency power and the second radio frequency power, and the pressure control of the heat transfer gas may be performed by the autonomous control.

Thus, according to the etching method and the plasma processing apparatus of the embodiments of the present invention, etching is facilitated by temperature control in an extremely low temperature.

Hereinabove, although the etching method and the plasma processing apparatus have been described according to the embodiments, the etching method and the plasma processing apparatus of the present invention is not limited to the embodiments, and various modifications and improvements can be made without departing from the scope of the invention. Moreover, the embodiments and modifications can be combined as long as they are not contradictory to each other.

For example, the above embodiments have been described by citing hydrogen gas as a hydrogen-containing gas and carbon tetrafluoride as a fluorine-containing gas. However, the hydrogen-containing gas is not limited to hydrogen gas ($H_2$), but the hydrogen-containing gas just has to include at least one gas of methane ($CH_4$) gas, fluoromethane ($CH_3F$) gas, difluoromethane ($CH_2F_2$) gas, and trifluoromethane ($CHF_3$) gas. Also, the fluorine-containing gas is not limited to carbon tetrafluoride, but may be $C_4F_6$ (hexafluoro-1, 3-butadiene) gas, $C_4F_8$ (perfluorocyclobutane) gas, $C_3F_8$ (Octafluoropropane) gas, $NF_3$ (nitrogen trifluoride), and $SF_8$ (sulfur hexafluoride).

Moreover, a process of removing a reaction product produced by an etching may be performed during the off time Toff of the second radio frequency power, or during the off time of Toff of the first radio frequency poser and the second radio frequency power. For example, by supplying oxygen ($O_2$) gas during the off time Toff, $O_2$ plasma generated from oxygen gas may serve to remove the reaction product attached to the top opening of the hole. Otherwise, by supplying hydrogen ($H_2$) gas and carbon fluoride ($CF_4$) gas, plasma generated from the mixed gas thereof may facilitate the etching and remove the reaction product.

Furthermore, the plasma processing apparatus according to the embodiments of the present invention can be applied not only to a capacitively coupled plasma (CCP: Capacitively Coupled Plasma) apparatus but also to other types of etching apparatuses. For example, the other types of plasma processing apparatus includes an inductively coupled plasma (ICP: Inductively Coupled Plasma) apparatus, a plasma processing apparatus using a radial line slot antenna, a helicon wave excited plasma (HWP: Helicon Wave Plasma) apparatus, an electron cyclotron resonance plasma (ECR: Electron Cyclotron Resonance Plasma) apparatus and the like as examples.

In the present specification, a semiconductor wafer W has been described as an etching object, but a variety of substrates used for a flat panel display, a substrate for an EL (electroluminescence) device and the like, a photomask, a CD substrate, and a printed substrate are available for the etching object.

What is claimed is:

1. An etching method comprising steps of:
    etching a silicon oxide film formed on a substrate by using plasma in a first condition in which a surface temperature of the substrate is controlled to have a temperature lower than −35 degrees C., and the plasma is generated from a hydrogen-containing gas and a fluorine-containing gas by using first radio frequency power output from a first radio frequency power source and second radio frequency power output from a second radio frequency power source; and
    etching the silicon oxide film by using the plasma in a second condition in which the output of the second radio frequency power from the second radio frequency power source is stopped,
    wherein the steps of etching the silicon oxide film by using the plasma in the first condition and etching the silicon oxide film by using the plasma in the second condition are alternately repeated multiple times.

2. The etching method as claimed in claim 1, wherein the hydrogen-containing gas includes at least one of hydrogen gas, methane gas, fluoromethane gas, difluoromethane gas, and trifluoromethane gas.

3. The etching method as claimed in claim 1, wherein the second radio frequency power has a surface power density value of 1.4 W/cm$^2$.

4. The etching method as claimed in claim 1, wherein the first radio frequency power and the second radio frequency power are applied to a pedestal that supports the substrate.

5. A etching method comprising steps of:
    etching a silicon oxide film formed on a substrate by using plasma in a first condition in which a surface temperature of the substrate is controlled to have a temperature lower than −35 degrees C., and the plasma is generated from a hydrogen-containing gas and a fluorine-containing gas by using first radio frequency power output from a first radio frequency power source and second radio frequency power output from a second radio frequency power source; and
    etching the silicon oxide film by using the plasma in a second condition in which the output of the first radio frequency power from the first radio frequency power source and the output of the second radio frequency power from the second radio frequency power source are stopped,
    wherein steps of etching the silicon oxide film by using the plasma in the first condition and etching the silicon oxide film by using the plasma in the second condition are alternately repeated multiple times.

6. The etching method as claimed in claim 5, wherein the hydrogen-containing gas includes at least one of hydrogen gas, methane gas, fluoromethane gas, difluoromethane gas, and trifluoromethane gas.

7. The etching method as claimed in claim 5, wherein the second radio frequency power has a surface power density value of 1.4 W/cm$^2$.

8. An etching method comprising steps of:
    mounting a substrate on a pedestal, said substrate having a silicon oxide film formed thereon,
    controlling a temperature of the substrate on which the silicon oxide film is formed to be lower than −35 degrees C.;
    supplying a hydrogen-containing gas and a fluorine-containing gas in a chamber;
    generating plasma of the hydrogen-containing gas and the fluorine-containing gas by applying first radio frequency power;
    etching the silicon oxide film on the substrate by controlling to alternately apply and stop second radio frequency power as bias electric power for the substrate multiple times.

9. The etching method as claimed in claim 8, wherein the first radio frequency power is continuous wave.

10. The etching method as claimed in claim 8, wherein the first radio frequency power is pulse wave.

11. The etching method as claimed in claim 10, wherein the method further include controlling the first radio frequency power and the second radio frequency power in synchronization with each other.

12. The etching method as claimed in claim 8, wherein the second radio frequency power is applied for 30 seconds or less.

13. The etching method as claimed in claim 8, wherein the second radio frequency power is stopped for 5 seconds or more.

14. The etching method as claimed in claim 8, wherein the second radio frequency power is stopped for less than 10 seconds.

15. The etching method as claimed in claim 8, wherein the etching is performed so as to achieve an aspect ratio of 20 or higher.

16. The etching method as claimed in claim 8, wherein the first radio frequency power and the second radio frequency power are applied to the pedestal.

17. The etching method as claimed in claim 8, wherein the second radio frequency power has a surface power density value of 1.4 W/cm$^2$.

18. The etching method as claimed in claim 8, wherein the controlling the second radio frequency power and a controlling pressure of a heat transfer gas that is supplied to an opposite side of the substrate relative to the silicon oxide film are performed according to a temperature change of the substrate.

19. The etching method as claimed in claim 18, wherein the method further include controlling the second radio frequency power to be applied upon detecting that the temperature of the substrate is lower than −35 degrees C.

20. The etching method as claimed in claim 8, wherein the method further include predicting the temperature of the substrate by measuring a temperature of a focus ring that is provided at a periphery of the substrate.

21. The etching method as claimed in claim 8, wherein the second radio frequency power is pulse wave.

\* \* \* \* \*